US012237002B2

(12) United States Patent
Locatelli et al.

(10) Patent No.: US 12,237,002 B2
(45) Date of Patent: *Feb. 25, 2025

(54) MEMORY CELL BIASING TECHNIQUES DURING A READ OPERATION

(71) Applicant: Micron Technology, Inc., Boise, ID (US)

(72) Inventors: Andrea Locatelli, Dalmine (IT); Giorgio Servalli, Fara Gera d'Adda (IT); Angelo Visconti, Appiano Gentile (IT)

(73) Assignee: Micron Technology, Inc., Boise, ID (US)

( * ) Notice: Subject to any disclaimer, the term of this patent is extended or adjusted under 35 U.S.C. 154(b) by 361 days.

This patent is subject to a terminal disclaimer.

(21) Appl. No.: 17/741,136

(22) Filed: May 10, 2022

(65) Prior Publication Data

US 2022/0270667 A1 Aug. 25, 2022

Related U.S. Application Data

(63) Continuation of application No. 16/834,941, filed on Mar. 30, 2020, now Pat. No. 11,348,635.

(51) Int. Cl.
*G11C 11/4096* (2006.01)
*G11C 11/22* (2006.01)
(Continued)

(52) U.S. Cl.
CPC ........ *G11C 11/4096* (2013.01); *G11C 11/221* (2013.01); *G11C 11/2273* (2013.01);
(Continued)

(58) Field of Classification Search
CPC .............. G11C 11/4096; G11C 11/221; G11C 11/2273; G11C 11/406; G11C 11/4091; G11C 11/4097
(Continued)

(56) References Cited

U.S. PATENT DOCUMENTS 5,270,967 A 12/1993 Moazzami et al.
7,995,415 B2 8/2011 Casper
(Continued)

FOREIGN PATENT DOCUMENTS

JP 2003-077271 A 3/2003
JP 2008-522346 A 6/2008

OTHER PUBLICATIONS

European Patent Office, "Supplementary European Search Report," issued in connection with European Patent Application No. 21781441.7 dated Aug. 4, 2023 (9 pages).
(Continued)

*Primary Examiner* — Connie C Yoha
(74) *Attorney, Agent, or Firm* — Holland & Hart LLP

(57) ABSTRACT

Methods, systems, and devices for biasing a memory cell during a read operation are described. For example, a memory device may bias a memory cell to a first voltage (e.g., a read voltage) during an activation phase of a read operation. After biasing the memory cell to the first voltage, the memory device may bias the memory cell to a second voltage greater than the first voltage (e.g., a write voltage) during the activation phase of the read operation. After biasing the memory cell to the second voltage, the memory device may initiate a refresh phase of the read operation. Based on a value stored by the memory cell prior to biasing the memory cell to the first voltage, the memory device may initiate a precharge phase of the read operation.

20 Claims, 8 Drawing Sheets

(51) Int. Cl.
  *G11C 11/406* (2006.01)
  *G11C 11/4091* (2006.01)
  *G11C 11/4097* (2006.01)
(52) U.S. Cl.
  CPC ........ *G11C 11/406* (2013.01); *G11C 11/4091* (2013.01); *G11C 11/4097* (2013.01)
(58) Field of Classification Search
  USPC .................................................... 365/230.03
  See application file for complete search history.

(56) References Cited

U.S. PATENT DOCUMENTS

| | | | |
|---|---|---|---|
| 8,462,573 | B2 | 6/2013 | Choi |
| 8,576,649 | B1 | 11/2013 | Nemati |
| 10,896,712 | B2 | 1/2021 | Visconti et al. |
| 10,964,372 | B2 | 3/2021 | Visconti et al. |
| 10,984,847 | B2 | 4/2021 | Visconti |
| 11,348,635 | B2 * | 5/2022 | Locatelli .................. G11C 7/02 |
| 2002/0060923 | A1 | 5/2002 | Thompson et al. |
| 2006/0120193 | A1 | 6/2006 | Casper |
| 2006/0221666 | A1 | 10/2006 | Kang et al. |
| 2007/0053226 | A1 | 3/2007 | Lee et al. |
| 2012/0147654 | A1 | 6/2012 | Qidwai |
| 2014/0177355 | A1 | 6/2014 | Kim |
| 2014/0334238 | A1 | 11/2014 | Ware et al. |
| 2016/0284399 | A1 | 9/2016 | Mantegazza et al. |
| 2017/0337962 | A1 | 11/2017 | Bayram et al. |
| 2019/0027202 | A1 | 1/2019 | Bedeschi et al. |
| 2023/0352073 | A1 * | 11/2023 | Visconti ................. G11C 17/18 |

OTHER PUBLICATIONS

Japan Patent Office, "JP Office Action," issued in connection with Japan Patent Application No. 2022-559472 dated Dec. 5, 2023 (8 pages) (4 pages of English Translation and 4 pages of Original Document).

International Search Report and Written Opinion received for PCT Patent Application No. PCT/US21/21508, mailed on Jun. 25, 2021, 8 pages.

Taiwan Intellectual Property Office, "Office Action," issued in connection with ROC (Taiwan) Patent Application No. 110108640, dated Dec. 14, 2021 (17 pages).

U.S. Appl. No. 16/441,722, by Visconti et al., filed Jun. 14, 2019 (89 pages).

U.S. Appl. No. 16/441,763, by Visconti et al., filed Jun. 14, 2019 (46 pages).

U.S. Appl. No. 16/441,806, by Visconti et al., filed Jun. 14, 2019 (41 pages).

* cited by examiner ns during a read
operation in accordance with examples as disclosed herein.

FIG. 8 shows a flowchart illustrating a method or methods
that support memory cell biasing techniques during a read
operation in accordance with examples as disclosed herein.

DETAILED DESCRIPTION

Memory devices may use various sensing operations to
determine a logic state stored by a memory cell of a memory
array. The memory device may apply one or more voltages
to the memory cell to execute the various sensing or read
operations. For example, the memory device may apply one
or more voltages to the memory cell during an activation
phase of the read operation. The memory device may
subsequently apply one or more additional voltages to the
memory cell during a refresh phase of the memory operation. Additionally, the memory device may apply one or
more voltages to the memory cell during a precharge phase
of the read operation. In some cases, the memory device may
apply relatively high voltages to the memory cell when
performing a read operation. Reading memory cells using
high voltages may cause parasitic effects such as larger
leakage currents. In turn, these effects may cause disturbances on memory cells in the memory array thereby
decreasing functionality and reliability when reading
memory cells. In some cases, reducing the voltage level of
the one or more voltages applied to the memory cell during
a sensing operation may improve a performance of the
memory device.

In accordance with examples as disclosed herein, a
memory device may reduce a voltage applied to the memory
cell during the activation phase of the read operation. Some
memory devices may bias the memory cell to a write voltage
during the activation phase of the read operation. A memory
device may reduce the voltage applied to the memory cell
during a first portion of the activation phase to a read voltage
that is less than the write voltage, as compared with other
read operations. For example, during the activation phase
the memory device may first bias the memory cell to a first
voltage (e.g., a read voltage) to determine a logic state stored
by the memory cell. The memory device may subsequently
increase the voltage bias of the memory cell to a second
voltage (e.g., a write voltage) during the activation phase of
the read operation. In some cases, reducing the voltage level
applied to the memory cell during the activation phase of the
read operation may maintain a performance of the read
operation while reducing the disturbances on other memory
cells caused by the read operation.

Features of the disclosure are initially described in the
context of a memory device and related circuitry as
described with reference to FIGS. 1 and 2. Features of the
disclosure are described in the context memory cell characteristics, and associated circuits, and timing diagrams, as
described with reference to as described with reference to
FIGS. 3-6. These and other features of the disclosure are
further illustrated by and described with reference to an
apparatus diagram and a flowchart that relate to memory cell
biasing techniques during a read operation as described with
reference to FIGS. 7 and 8.

FIG. 1 illustrates an example of a memory device 100 that
supports differential sensing for a memory device in accordance with examples as disclosed herein. The memory
device 100 may also be referred to as an electronic memory
apparatus. The memory device 100 may include memory
cells 105 that are programmable to store different logic

MEMORY CELL BIASING TECHNIQUES DURING A READ OPERATION

CROSS REFERENCE

The present application for patent is a continuation of
U.S. patent application Ser. No. 16/834,941 by Locatelli et
al., entitled "MEMORY CELL BIASING TECHNIQUES
DURING A READ OPERATION," filed Mar. 30, 2020,
assigned to the assignee hereof, and is expressly incorporated by reference in its entirety herein.

BACKGROUND

The following relates generally to a system that includes
at least one memory device and more specifically to memory
cell biasing techniques during a read operation.

Memory devices are widely used to store information in
various electronic devices such as computers, wireless communication devices, cameras, digital displays, and the like.
Information is stored by programming memory cells within
a memory device to various states. For example, binary
memory cells may be programmed to one of two supported
states, often denoted by a logic 1 or a logic 0. In some
examples, a single memory cell may support more than two
states, any one of which may be stored. To access the stored
information, a component of the device may read, or sense,
at least one stored state in the memory device. To store
information, a component of the device may write, or
program, the state in the memory device.

Various types of memory devices exist, including magnetic hard disks, random access memory (RAM), read-only
memory (ROM), dynamic RAM (DRAM), synchronous
dynamic RAM (SDRAM), ferroelectric RAM (FeRAM),
magnetic RAM (MRAM), resistive RAM (RRAM), flash
memory, phase change memory (PCM), and others. Memory
devices may be volatile or non-volatile. Non-volatile
memory, e.g., FeRAM, may maintain their stored logic state
for extended periods of time even in the absence of an
external power source. Volatile memory devices, e.g.,
DRAM, may lose their stored state when disconnected from
an external power source. FeRAM may be able to achieve
densities similar to volatile memory but may have non-volatile properties due to the use of a ferroelectric capacitor
as a storage device.

Figure 1:
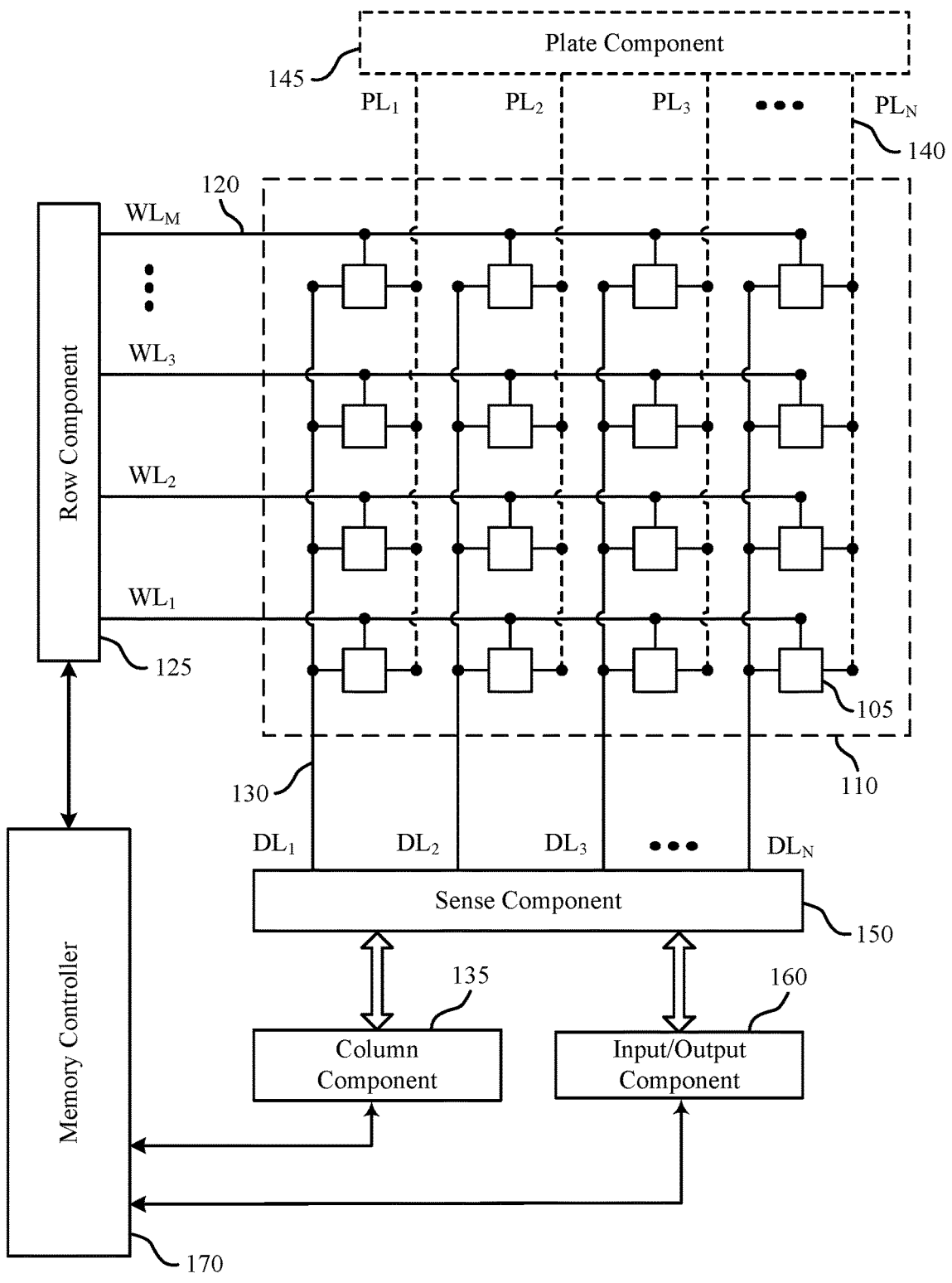
FIG. 1 illustrates an example of a memory device that
supports memory cell biasing techniques during a read
operation in accordance with examples as disclosed herein.

states. In some cases, a memory cell 105 may be programmable to store two logic states, denoted a logic 0 and a logic 1. In some cases, a memory cell 105 may be programmable to store more than two logic states (e.g., as a multi-level cell (MLC)). The set of memory cells 105 may be part of a memory section 110 of the memory device 100 (e.g., including an array of memory cells 105), where, in some examples, a memory section 110 may refer to a contiguous tile of memory cells 105 (e.g., a contiguous set of elements of a semiconductor chip).

In some examples, a memory cell 105 may store an electric charge representative of the programmable logic states (e.g., storing charge in a capacitor, capacitive memory element, capacitive storage element). In one example, a charged and uncharged capacitor may represent two logic states, respectively. In another example, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive) material between terminals of the capacitor. Different levels or polarities of polarization of a ferroelectric capacitor may represent different logic states (e.g., supporting two or more logic states in a respective memory cell 105).

In the example of memory device 100, each row of memory cells 105 may be coupled with one of a set of first access lines 120 (e.g., a word line (WL), such as one of $WL_1$ through $WL_M$), and each column of memory cells 105 may be coupled with one of a set of second access lines 130 (e.g., a digit line (DL), such as one of $DL_1$ through $DL_N$). In general, one memory cell 105 may be located at the intersection of (e.g., coupled with, coupled between) an access line 120 and an access line 130. This intersection may be referred to as an address of a memory cell 105. A target or selected memory cell 105 may be a memory cell 105 located at the intersection of an energized or otherwise selected access line 120 and an energized or otherwise selected access line 130.

In some architectures, a storage component of a memory cell 105 may be electrically isolated (e.g., selectively isolated) from a second access line 130 by a cell selection component, which, in some examples, may be referred to as a switching component or a selector device of or otherwise associated with the memory cell 105. A first access line 120 may be coupled with the cell selection component (e.g., via a control node or terminal of the cell selection component), and may control the cell selection component of the memory cell 105. For example, the cell selection component may be a transistor and the first access line 120 may be coupled with a gate of the transistor (e.g., where a gate node of the transistor may be a control node of the transistor). Activating a first access line 120 may result in an electrical connection or closed circuit between a respective logic storing component of one or more memory cells 105 and one or more corresponding second access lines 130. A second access line 130 may then be accessed to read from or write to the respective memory cell 105.

In some examples, memory cells 105 may also be coupled with one of a plurality of third access lines 140 (e.g., a plate line (PL), such as one of $PL_1$ through $PL_N$). In some examples, each of the third access lines 140 may be independently addressable (e.g., supporting individual selection or biasing). In some examples, the plurality of third access lines 140 may represent or be otherwise functionally equivalent with a common plate, or other common node (e.g., a plate node common to each of the memory cells 105 in the memory section 110). When a memory cell 105 employs a capacitor for storing a logic state, a second access line 130 may provide access to a first terminal or a first plate of the capacitor, and a third access line 140 may provide access to a second terminal or a second plate of the capacitor. Although the plurality of third access lines 140 of the memory device 100 are shown as substantially parallel with the plurality of second access lines 130, in other examples, a plurality of third access lines 140 may be substantially parallel with the plurality of first access lines 120, or in any other configuration (e.g., a common planar conductor, a common plate material).

Access operations such as reading, writing, rewriting, and refreshing may be performed on a memory cell 105 by activating or selecting a first access line 120, a second access line 130, or a third access line 140 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105. Access lines 120, 130, and 140 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds.

Accessing memory cells 105 may be controlled through a row component 125 (e.g., a row decoder), a column component 135 (e.g., a column decoder), or a plate component 145 (e.g., a plate decoder, a plate driver), or a combination thereof. For example, a row component 125 may receive a row address from the memory controller 170 and activate the appropriate first access line 120 based on the received row address. Similarly, a column component 135 may receive a column address from the memory controller 170 and activate the appropriate second access line 130. In some examples, such access operations may be accompanied by a plate component 145 biasing one or more of the third access lines 140 (e.g., biasing one of the third access lines 140, biasing the third access lines 140, biasing a common plate).

In some examples, the memory controller 170 may control operations (e.g., read operations, write operations, rewrite operations, refresh operations) of memory cells 105 through the various components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired access line 120 and access line 130. The memory controller 170 may also generate or control various voltages or currents used during the operation of memory device 100.

In various examples, one, multiple, or all memory cells 105 within memory device 100 may be accessed simultaneously. For example, each of the memory cells 105 that share a common access line 120, or some subset of the memory cells 105 that share a common access line 120 (e.g., a common cell selection line), may be accessed simultaneously (e.g., according to a memory row access arrangement, according to a "page" access arrangement, according to a set of access lines 130 or columns that may be accessed or sensed simultaneously). In another example, multiple or all memory cells 105 of memory device 100 may be accessed simultaneously during a reset operation in which memory cells 105, or a group of memory cells 105 (e.g., the memory cells 105 of a memory section 110), are set to a single logic state.

A memory cell 105 may be read (e.g., sensed) by a sense component 150 when the memory cell 105 is accessed (e.g., in cooperation with the memory controller 170) to determine a logic state written to or stored by the memory cell 105. For example, during an activation phase of a read operation the sense component 150 may be configured to evaluate a current or charge transfer through or from the memory cell 105, or a voltage resulting from coupling the memory cell 105 with the sense component 150, responsive to a read operation. The sense component 150 may provide an output signal indicative of the logic state read from the memory cell 105 to one or more components (e.g., to the column component 135, the input/output component 160, to the memory controller 170).

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set of access lines 130 connected to the sense component 150. For example, a sense component 150 may include a separate sensing circuit (e.g., a separate or duplicated sense amplifier, a separate or duplicated signal development component) for each of a set of access lines 130 coupled with the sense component 150, such that a logic state may be separately detected for a respective memory cell 105 coupled with a respective one of the set of access lines 130.

During the activation phase of the read operation, the memory controller 170 may bias a memory cell 105 (e.g., a target memory cell 105 to be read during an execution of the read operation) by applying one or more voltages to the memory cell 105. For example, the row component 125 may bias an access line 120 (e.g., WL1) to a first voltage (e.g., a read voltage). While the memory cell is biased to the first voltage, the sense component 150 may be configured to evaluate an amount of charge stored in the memory cell 105 (e.g., based on a logic value stored by the memory cell 105). After biasing the memory cell 105 to the first voltage, the row component 125 may bias the memory cell 105 to a second voltage greater than the first voltage (e.g., a write voltage) during the activation phase of the read operation. The second voltage may be approximately equal to a saturation voltage associated with the memory cell 105. That is, biasing the memory cell 105 to the second voltage may cause the memory cell 105 to saturate or be associated with a saturated charge capacity.

In some memory architectures, accessing a memory cell 105 may degrade or destroy a stored logic state, and rewrite or refresh operations may be performed to return the stored logic state to memory cell 105 (e.g., during a refresh phase and/or a precharge phase of the read operation). In DRAM or FeRAM, for example, a capacitor of a memory cell 105 may be partially or completely discharged or depolarized during a sense operation, thereby corrupting the logic state that was stored in the memory cell 105. Thus, in some examples, the logic state stored in a memory cell 105 may be rewritten after an access operation. Further, activating a single access line 120, 130, or 140 may result in the discharge of memory cells 105 coupled with the activated access line 120, 130, or 140. Thus, one or more memory cells 105 coupled with an access line 120, 130, or 140 associated with an access operation (e.g., cells of an accessed row, cells of an accessed column) may be rewritten after an access operation.

In some examples, reading a memory cell 105 may be non-destructive. That is, the logic state of the memory cell 105 may not be rewritten after the memory cell 105 is read. However, in some examples, refreshing the logic state of the memory cell 105 may or may not be needed in the absence or presence of other access operations. For example, the logic state stored by a memory cell 105 may be refreshed at periodic intervals by applying an appropriate write, rewrite, or refresh bias to maintain the stored logic state.

A memory cell 105 may be set, or written, by activating the relevant first access line 120, second access line 130, or third access line 140 (e.g., via a memory controller 170). In other words, a logic state may be stored in a memory cell 105. Row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element).

Figure 2:
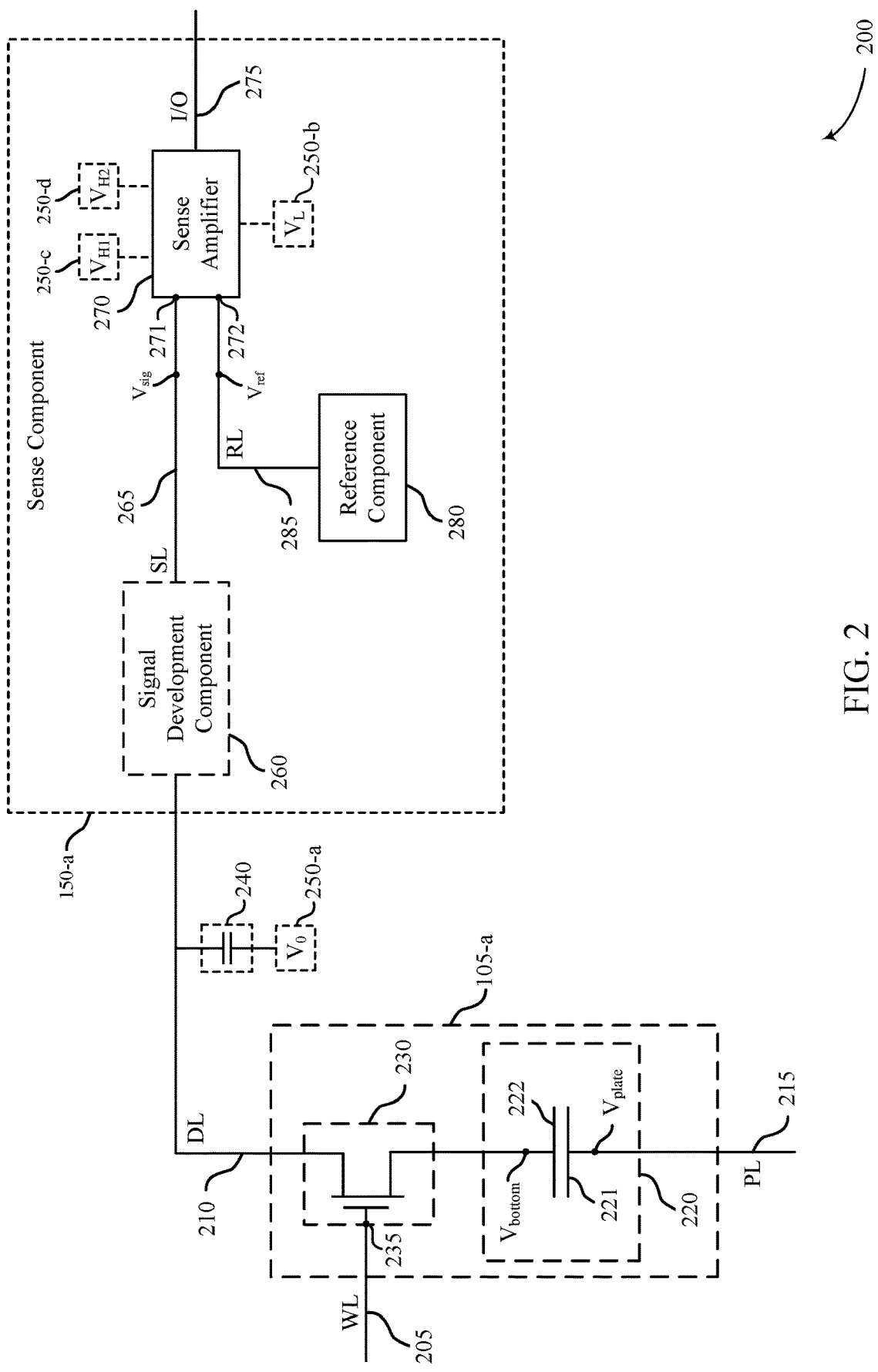
FIG. 2 illustrates an example of a circuit that supports
memory cell biasing techniques during a read operation in
accordance with examples as disclosed herein.

FIG. 2 illustrates an example circuit 200 that supports differential sensing for a memory device in accordance with examples as disclosed herein. Circuit 200 includes a memory cell 105-a and a sense component 150-a, which may be examples of the respective components as described with reference to FIG. 1. Circuit 200 also includes a word line 205, a digit line 210, and a plate line 215, which, in some examples, may correspond to a first access line 120, a second access line 130, and a third access line 140, respectively (e.g., of a memory section 110), as described with reference to FIG. 1. In various examples, the plate line 215 may be illustrative of an independently-addressable plate line, or a common plate node (e.g., or a memory section 110 that includes the memory cell 105-*a*).

The memory cell 105-*a* may include a logic storage component (e.g., a memory element, a storage element, a memory storage element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The cell plate 221 may be accessed via the plate line 215 and cell bottom 222 may be accessed via the digit line 210. As described herein, various logic states may be stored by charging, discharging, or polarizing the capacitor 220.

The capacitor 220 may be electrically connected to the digit line 210, and the stored logic state of the capacitor 220 may be read or sensed by operating various elements represented in circuit 200. For example, the memory cell 105-*a* may also include a cell selection component 230 which, in some examples, may be referred to as a switching component or a selector device coupled with or between an access line (e.g., the digit line 210) and the capacitor 220. In some examples, a cell selection component 230 may be considered to be outside the illustrative boundary of the memory cell 105-*a*, and the cell selection component 230 may be referred to as a switching component or selector device coupled with or between an access line (e.g., the digit line 210) and the memory cell 105-*a*.

The capacitor 220 may be selectively coupled with the digit line 210 when the cell selection component 230 is activated (e.g., by way of an activating logical signal), and the capacitor 220 can be selectively isolated from the digit line 210 when the cell selection component 230 is deactivated (e.g., by way of a deactivating logical signal). A logical signal or other selection signal or voltage may be applied to a control node 235 of the cell selection component 230 (e.g., via the word line 205). In other words, the cell selection component 230 may be configured to selectively couple or decouple the capacitor 220 and the digit line 210 based on a logical signal or voltage applied via the word line 205 to the control node 235.

Activating the cell selection component 230 may be referred to as selecting or activating the memory cell 105-*a*, and deactivating the cell selection component 230 may be referred to as deselecting or deactivating the memory cell 105-*a*. In some examples, the cell selection component 230 is a transistor and its operation may be controlled by applying an activation voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor. In some examples, activating the cell selection component 230 may be referred to as selectively coupling the memory cell 105-*a* with the digit line 210.

Biasing the plate line 215 or the digit line 210 may result in a voltage difference (e.g., the voltage of the digit line 210 minus the voltage of the plate line 215) across the capacitor 220. The voltage difference may accompany a change in the charge stored by the capacitor 220 (e.g., due to charge sharing between the capacitor 220 and the digit line 210, due to charge sharing between the capacitor 220 and the plate line 215), and the magnitude of the change in stored charge may depend on the initial state of the capacitor 220 (e.g., whether the initial charge or logic state stored a logic 1 or a logic 0).

To perform a read operation on the memory cell 105-*a*, a first voltage may be applied across the capacitor 220 during an activation phase of the read operation by increasing the voltage of the digit line 210 and holding a voltage of the plate line 215 to a constant voltage (e.g., approximately 0 volts). While the capacitor 220 is biased to the first voltage, charge may flow into or out of the capacitor 220. After biasing the memory cell 105-*a* to the first voltage, the voltage of the digit line 210 may be increased to a second voltage to bias the capacitor 220 to the second voltage (e.g., a write voltage) during the activation phase of the read operation. Biasing the capacitor 220 to the second voltage may cause the capacitor 220 to saturate (e.g., be associated with a saturated charge capacity).

The digit line 210 may be coupled with additional memory cells 105 (not shown), and the digit line 210 may have properties that result in a non-negligible intrinsic capacitance 240 (e.g., on the order of picofarads (pF)), which may couple the digit line 210 with a voltage source 250-*a*. The voltage source 250-*a* may represent a common ground or virtual ground voltage, or the voltage of an adjacent access line of the circuit 200 (not shown). Although illustrated as a separate element in FIG. 2, the intrinsic capacitance 240 may be associated with properties distributed throughout the digit line 210.

The sense component 150-*a* may include a signal development component 260 and a sense amplifier 270 coupled with the signal development component 260 via a signal line 265. In various examples, the signal development component 260 may include circuitry configured to amplify or otherwise convert signals of the digit line 210 prior to a logic state detection operation (e.g., by the sense amplifier 270). The signal development component 260 may include, for example, a transistor, an amplifier, a cascode, or any other circuitry configured to develop a signal for sensing a logic state stored by the memory cell 105-*a*. In some examples, the signal development component 260 may include a charge transfer sensing amplifier (CTSA), which may include one or more transistors in a cascode or voltage control configuration.

Although the digit line 210 and the signal line 265 are identified as separate lines, the digit line 210, the signal line 265, and any other lines connecting a memory cell 105 with a sense amplifier 270 may be referred to as a single access line (e.g., of or associated with the memory cell 105). Constituent portions of such an access line may be identified separately for the purposes of illustrating intervening components and intervening signals in various example configurations.

The sense amplifier 270 may include a first node 291 and a second node 292 which, in some examples, may be coupled with different access lines of a circuit (e.g., a signal line 265 and a reference line 285 of the circuit 200, respectively) or, in other examples, may be coupled with a common access line of a different circuit (not shown). In some examples, the first node 291 may be referred to as a signal node, and the second node 292 may be referred to as a reference node. However, other configurations of access lines or reference lines may be used to support the techniques described herein.

The sense amplifier 270 may include various transistors or amplifiers to detect, convert, or amplify a difference in signals, which may be referred to as latching. For example, the sense amplifier 270 may include circuit elements that receive and compare a sense signal voltage (e.g., $V_{sig}$, of the signal line 265) at a first node 291 with a reference signal voltage (e.g., $V_{ref}$, of a reference line 285) at a second node 292. A voltage of the first node 271 may be based on accessing the memory cell 105-*a*, such as a voltage based at least in part on a charge transfer of the capacitor 220 while the cell selection component 230 is activated. In some examples, a voltage of the second node 292 may be provided by a reference component 280. In other examples, the reference component 280 may be omitted and a reference voltage may be provided, for example, by accessing the memory cell 105-*a* to generate the reference voltage (e.g., in a self-referencing access operation). An output of the sense amplifier 270 may be driven to a relatively higher voltage (e.g., a positive voltage) or a relatively lower voltage (e.g., a negative voltage, a ground voltage) based on the comparison at the sense amplifier 270.

The sense amplifier 270 may output a detected logic state via one or more I/O lines 275 based on a comparison of signals at the first node 271 and the second node 272. For example, if the first node 271 has a lower voltage than the second node 272, an output of the sense amplifier 270 may be driven to a relatively lower voltage of a first sense amplifier voltage source 250-*b* (e.g., a voltage of $V_L$, which may be a ground voltage substantially equal to $V_0$ or a negative voltage). If the first node 271 has a higher voltage than the second node 272, an output of the sense amplifier 270 may be driven to the voltage of a second sense amplifier voltage source 250-*c* (e.g., a voltage of $V_H$). The sense component 150-*a* may latch the output of the sense amplifier 270 to determine the logic state stored in the memory cell 105-*a* (e.g., latching or determining a logic 0 when the first node 271 has a lower voltage than the second node 272, latching or determining a logic 1 when the first node 271 has a higher voltage than the second node 272). The latched output of the sense amplifier 270, corresponding to the detected logic state of memory cell 105-*a*, may be output via one or more input/output (I/O) lines (e.g., I/O line 275), which may include an output through a column component 135 or an input/output component 160 described with reference to FIG. 1.

To perform a write operation on the memory cell 105-*a*, a voltage may be applied across the capacitor 220 by controlling the voltage of the cell plate 221 (e.g., through the plate line 215) and the cell bottom 222 (e.g., through the digit line 210). For example, to write a logic 0, the cell plate 221 may be taken low (e.g., grounding the plate line 215, virtually grounding the plate line 215, applying a negative voltage to the plate line 215), and the cell bottom 222 may be taken high (e.g., applying a positive voltage to the digit line 210). The opposite process may be performed to write a logic 1, where the cell plate 221 is taken high and the cell bottom 222 is taken low. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220.

The circuit 200, including the sense amplifier 270, the cell selection component 230, the signal development component 260, or the reference component 280, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., a drain terminal and the source terminal, across a conduction channel).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In some examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying drain and source voltages. For example, the applied voltage at the gate terminal may have a particular voltage level (e.g., a clamping voltage) that is used to enable conductivity between the drain terminal and the source terminal when the source terminal voltage is below a certain level (e.g., below the gate terminal voltage minus the threshold voltage). When the voltage of the source terminal rises above the certain level, the n-type transistor may be deactivated such that the conductive path between the drain terminal and source terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., a drain terminal and the source terminal, across a conductive channel).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In some examples where a p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying drain and source voltages. For example, the applied voltage at the gate terminal may have a particular voltage level that is used to enable conductivity between the drain terminal and the source terminal so long as the source terminal voltage is above a certain level (e.g., above the gate terminal voltage plus the threshold voltage). When the voltage of the source terminal voltage falls below the certain level, the p-type transistor may be deactivated such that the conductive path between the drain terminal and source terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In some examples, the transistor(s) may be formed on a substrate that is dedicated to a particular component of the circuit 200 (e.g., a substrate for the sense amplifier 270, a substrate for the signal development component 260, a substrate for the reference component 280, a substrate for the memory cell 105-a), or the transistor(s) may be formed on a substrate that is common for particular components of the circuit 200 (e.g., a substrate that is common to two or more of the sense amplifier 270, the signal development component 260, the reference component 280, or the memory cell 105-a). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

Although the circuit 200 illustrates a set of components relative to a single memory cell 105, various components of the circuit 200 may be duplicated in a memory device 100 to support various operations. For example, to support row access or page access operations, a sense component 150 may be configured with multiples of one or more of a signal development component 260, a signal line 265, a reference component 280, a reference line 285, a sense amplifier 270, or other components, where the multiples may be configured according to a quantity of memory cells 105 that may be accessed in a row access or page access operation (e.g., in a concurrent operation). In various examples, a set of such multiples may correspond to or otherwise be repeated for each memory section 110 in a memory device 100, or such a set of multiples may be shared among one or more memory sections 110 in a memory device.

Figure 3A:
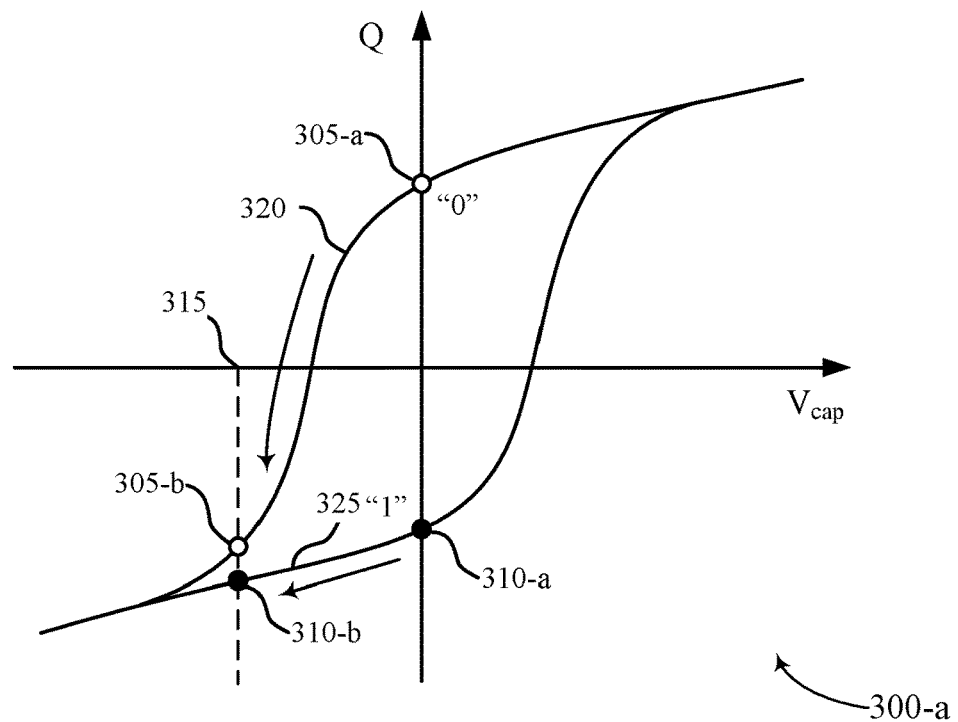
FIGS. 3A and 3B illustrate examples of non-linear electrical properties of a ferroelectric memory cell in accordance
with examples as disclosed herein.
Figure 3B:
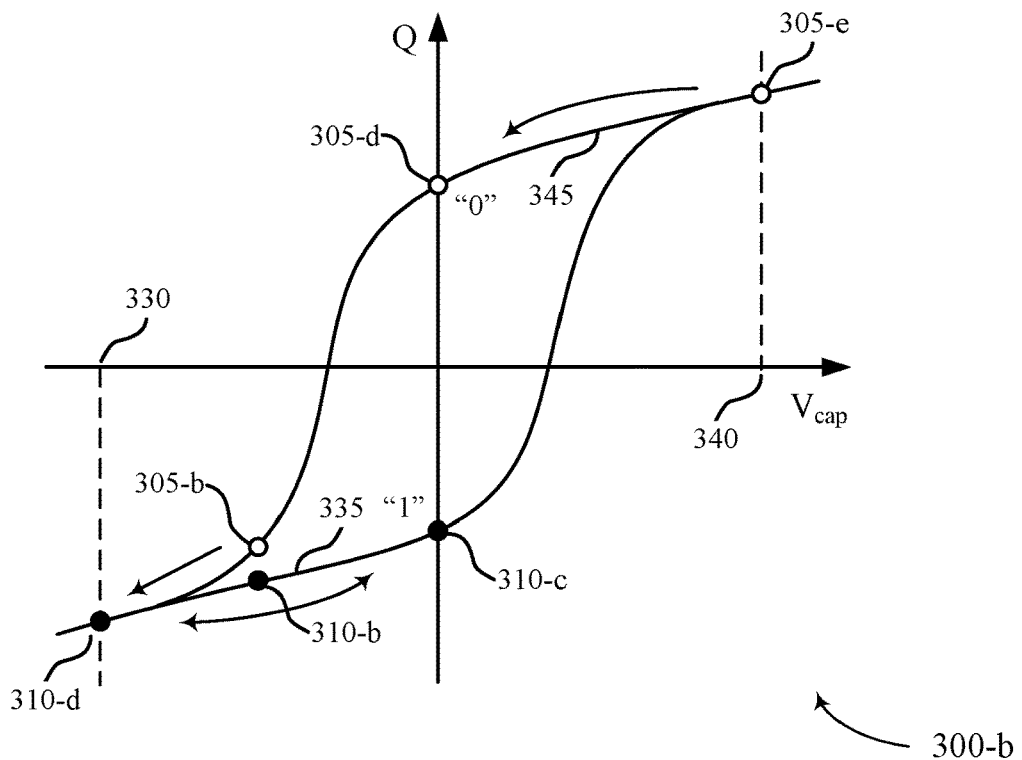

FIGS. 3A and 3B illustrate examples of non-linear electrical properties of a ferroelectric memory cell with hysteresis plots 300-a and 300-b, respectively, in accordance with various examples as disclosed herein. The hysteresis plots 300-a and 300-b may illustrate examples of various phases within a read operation of a memory cell 105 employing a ferroelectric capacitor 220 as described with reference to FIG. 2. The hysteresis plots 300-a and 300-b depict the charge, Q, stored on a ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a cell bottom 222 and a cell plate 221 (e.g., $V_{bottom}-V_{plate}$, $V_{DL}-V_{PL}$).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge may be stored at the interface of the ferroelectric material and the capacitor terminals.

FIG. 3A may include a hysteresis plot 300-a illustrating the process of applying a read voltage 315 to the memory cell during the activation phase of a read operation. As depicted in the hysteresis plot 300-a, a ferroelectric material used in a ferroelectric capacitor 220 may maintain a positive or negative polarization when there is no net voltage difference between the terminals of the ferroelectric capacitor 220. For example, the hysteresis plot 300-a illustrates two possible polarization states, a charge state 305-a and a charge state 310-a, which may represent a positively saturated polarization state and a negatively saturated polarization state, respectively. The charge states 305-a and 310-a may be at a physical condition illustrating remnant polarization (Pr) values, which may refer to the polarization (or charge) that remains upon removing an external bias (e.g., voltage). According to the example of the hysteresis plot 300-a, the charge state 305-a may represent a logic 0 when no voltage difference is applied across the ferroelectric capacitor 220, and the charge state 310-a may represent a logic 1 when no voltage difference is applied across the ferroelectric capacitor 220. In some examples, the logic values of the respective charge states or polarization states may be reversed or interpreted in an opposite manner to accommodate other schemes for operating a memory cell 105.

To read, or sense, the stored state of a ferroelectric capacitor 220, a voltage (e.g., a read voltage) may also be applied across the ferroelectric capacitor 220. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-a, or the charge state 310-a, or some other charge state was initially stored, among other factors.

The hysteresis plot 300-a illustrates an example for applying the read voltage during the activation phase of a read operation to read stored charge states 305-a and 310-a. A read voltage 315 may be applied, for example, as a voltage difference via a digit line 210 and a plate line 215 as described with reference to FIG. 2. The hysteresis plot 300-a may illustrate read operations where the read voltage 315 is negative voltage difference $V_{cap}$ (e.g., where $V_{bottom}-V_{plate}$ is negative, where $V_{DL}$ is less $V_{PL}$). A negative read voltage across the ferroelectric capacitor 220 may be referred to as a "plate high" read operation, where a digit line 210 is taken initially to a low voltage (e.g., a ground voltage), and a plate line 215 is initially at a high voltage. Although the read voltage 315 is shown as a negative voltage across the ferroelectric capacitor 220, in alternative access operations, a read voltage may be a positive voltage across the ferroelectric capacitor 220, which may be referred to as a "plate low" read operation.

The read voltage 315 may be applied across the ferroelectric capacitor 220 while a memory cell 105 is selected (e.g., by activating a cell selection component 230 via a word line 205 as described with reference to FIG. 2). Upon applying the read voltage 315 to the ferroelectric capacitor 220, charge may flow into or out of the ferroelectric capacitor 220 via the associated digit line 210 and plate line 215, and, in some examples, different charge states or access line voltages may result depending on whether the ferroelectric capacitor 220 was at the charge state 305-*a* (e.g., storing a logic 0) or at the charge state 310-*a* (e.g., storing a logic 1), or some other charge state.

When performing a read operation on a ferroelectric capacitor 220 at the charge state 305-*a* (e.g., a logic 0), the stored charge may reverse polarity as a net negative charge accumulates across the ferroelectric capacitor 220. In some cases, the read voltage 315 may be reduced (e.g., compared to a write voltage associated with a greater voltage being applied across the memory cell). Here, the reduced read voltage 315 may be applied across the ferroelectric capacitor 220 and the charge state may follow the path 320 until reaching the charge and voltage of the charge state 305-*b*. Because the reduced read voltage 315 is applied (e.g., instead of a write voltage), the charge state may not follow the path 320 past charge state 305-*b* during a first portion of the activation phase of the read operation. The amount of charge flowing through the capacitor 220 may be related to the intrinsic or other capacitance of the digit line 210 or other access line. In a "plate high" read configuration, a read operation associated with the charge states 305-*a* and 305-*b*, or more generally a read operation associated with the logic 0 state, may be associated with a relatively large amount of charge transfer (e.g., compared to a read operation associated with the charge states 310-*a* and 310-*b*, or more generally the logic 1 state).

When performing the read operation on a ferroelectric capacitor 220 at the charge state 310-*a* (e.g., a logic 1), additional negative charge may accumulate across the ferroelectric capacitor 220. In some cases, a read voltage 315 may be applied across the ferroelectric capacitor 220 and the charge state may follow the path 325 until reaching the charge and voltage of the charge state 310-*b*. Because the read voltage 315 is applied (e.g., instead of a larger write voltage), the charge state 310 may not follow the path 325 past charge state 310-*b* during a first portion of the activation phase of the read operation. The amount of charge flowing through the capacitor 220 may be related to the intrinsic or other capacitance of the digit line 210 or other access line. In a "plate high" read configuration, a read operation associated with the charge states 310-*a* and 310-*b*, or more generally a read operation associated with the logic 1 state, may be associated with a relatively small amount of charge transfer (e.g., compared to a read operation associated with the charge states 305-*a* and 305-*b*, or more generally the logic 0 state).

The position of the charge state 305-*b* and the charge state 310-*b* after initiating a read operation may depend on a plurality of factors, including the specific sensing scheme and circuitry. In some cases, the final charge may depend on the net capacitance of a digit line 210 coupled with the memory cell 105, which may include an intrinsic capacitance 240, an integrator capacitor (e.g., of a sense component 150), and others. For example, if a ferroelectric capacitor 220 is electrically coupled with a digit line 210 and the read voltage 315 is applied, the voltage of the digit line 210 may fall when the memory cell 105 is selected due to charge flowing from the net capacitance of the digit line 210 to the ferroelectric capacitor 220. Thus, in some examples, a voltage measured at a sense component 150 may not be equal to the read voltage 315, and instead may depend on the voltage of the digit line 210 or other access line following a period of charge sharing.

The initial state (e.g., charge state, logic state) of the ferroelectric capacitor 220 may be determined by comparing the voltage of a digit line 210, or signal line 265 where applicable, resulting from the read operation with a reference voltage (e.g., via a reference line 285 as described with reference to FIG. 2). In some examples, the digit line voltage may be the sum of the plate line voltage and the final voltage across the ferroelectric capacitor 220 (e.g., voltage of charge state 305-*b* when reading the ferroelectric capacitor 220 having a stored charge state 305-*a*, or voltage of charge state 310-*b* when reading the ferroelectric capacitor 220 having a stored charge state 310-*a*).

FIG. 3B may include a hysteresis plot 300-*b* illustrating the process of applying a write voltage 330 to the memory cell during the activation phase of the read operation as well as the refresh and precharge phases of the read operation. In some cases, the process illustrated by the hysteresis plot 300-*b* may occur after the process illustrated by the hysteresis plot 300-*a*.

A logic 0 or 1 may be written to the memory cell 105 by controlling the electric polarization of the ferroelectric material, and thus the charge on the capacitor terminals, by applying a net voltage difference across the ferroelectric capacitor 220. For example, after biasing the ferroelectric capacitor 220 to either charge state 305-*b* (e.g., when reading the ferroelectric capacitor 220 having a stored charge state 305-*a*) or charge state 310-*b* (e.g., when reading the ferroelectric capacitor 220 having a stored charge state 310-*a*) of FIG. 3A, a voltage 330 may be applied across the ferroelectric capacitor 220. The voltage 330 may correspond to a write voltage 330 and may be greater than the read voltage 315 applied to the memory cell prior to applying the write voltage 330. Additionally, the voltage 330 may be a voltage equal to or lesser than a negative saturation voltage, and applying the voltage 330 across the ferroelectric capacitor 220 may result in charge accumulation until the charge state 310-*d* is reached (e.g., writing a logic 1).

Upon removing the voltage 330 from the ferroelectric capacitor 220 (e.g., applying a zero net voltage across the terminals of the ferroelectric capacitor 220), the charge state of the ferroelectric capacitor 220 may follow the path 335 shown between the charge state 310-*d* and the charge state 310-*c* at zero voltage across the capacitor. In other words, charge state 310-*c* may represent a logic 1 state at an equalized voltage across a ferroelectric capacitor 220 that has been negatively saturated.

Similarly, after biasing the ferroelectric capacitor 220 to either charge state 305-*b* or charge state 310-*b*, a voltage 340 may be applied across the ferroelectric capacitor 220 (e.g., during a precharge phase of the read operation). The voltage 340 may be a voltage equal to or greater than a positive saturation voltage, and applying the voltage 340 across the ferroelectric capacitor 220 may result in charge accumulation until the charge state 305-*e* is reached (e.g., writing a logic 0). Upon removing the voltage 340 from the ferroelectric capacitor 220 (e.g., applying a zero net voltage across the terminals of the ferroelectric capacitor 220), the charge state of the ferroelectric capacitor 220 may follow the path 345 shown between the charge state 305-*e* and the charge state 305-*d* at zero voltage across the capacitor. In other words, charge state 305-*d* may represent a logic 0 state at an equalized voltage across a ferroelectric capacitor 220 that has been positively saturated. In some examples, the voltage 330 and the voltage 340, representing saturation voltages, may have the same magnitude, but opposite polarity across the ferroelectric capacitor 220.

Figure 4:
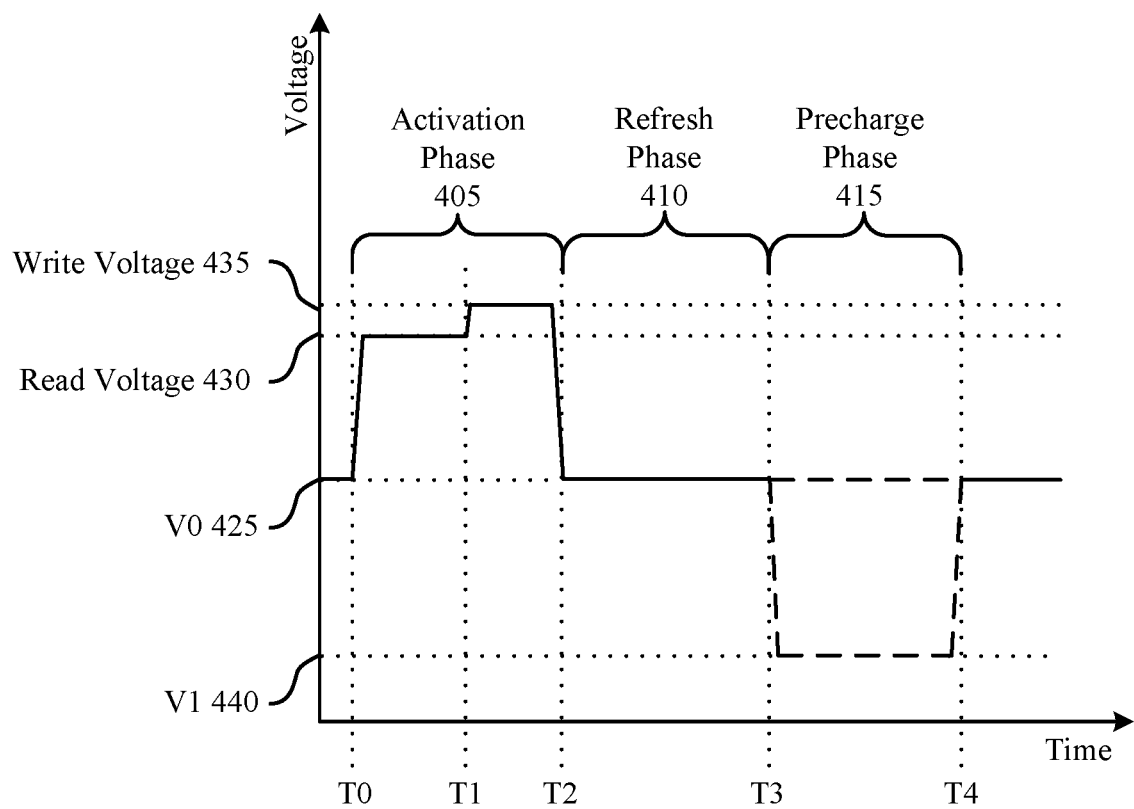
FIG. 4 illustrates a timing diagram that supports memory
cell biasing techniques during a read operation in accordance with examples as disclosed herein.

FIG. 4 illustrates a timing diagram 400 that supports memory cell biasing during a read operation technique in accordance with examples of the present disclosure. Timing diagram 400 may illustrate a voltage across a memory cell (e.g., memory cells 105 as described with reference to FIGS.

1 through 3) throughout a read operation. The read operation may include an activation phase 405, a refresh phase 410, and a precharge phase 415.

Prior to being accessed, the memory cell may be biased to a voltage 425 (e.g., V0), which may be approximately equal to 0 volts. Then at T0, the memory cell may be accessed during the activation phase 405 of the read operation by biasing the cell to the read voltage 430. The read voltage 430 may be applied to the memory cell based on a voltage difference between the plate line and digit line as described with reference to FIG. 3. Here, the voltage of the digit line may be approximately equal to the read voltage 430 and the voltage of the plate line may be approximately equal to 0 volts. In some cases, the polarity of the read voltage may be reversed (e.g., from a positive polarity to a negative polarity). That is, the voltage of the plate line may be approximately equal to the read voltage 430 and the voltage of the digit line may be approximately equal to 0 volts. Applying the read voltage 430 may cause the charge state of the memory cell may follow the path 320 or 325 based on a logic state of the memory cell prior to biasing the memory cell to the read voltage 430 as described with reference to FIG. 3A.

At time T1, the write voltage 435 may be applied to the memory cell. That is, the voltage applied to the memory cell may be increased from the read voltage 430 to the write voltage 435. In some cases, the write voltage 435 may be applied to the memory cell by increasing the voltage of the digit line from approximately equal to the read voltage 430 to approximately equal to the write voltage 435. In some other cases (e.g., when the polarity of the voltages applied to the memory cell are reversed), the write voltage 435 may be applied to the memory cell by increasing the voltage of the plate line from approximately equal to the read voltage 430 to approximately equal to the write voltage 435. The write voltage 435 may correspond to a voltage equal to or greater than a saturation voltage associated with the memory cell. Thus, applying the write voltage 435 to the memory cell may cause the charge state of the memory cell to follow the hysteresis curve to a saturation point as described with reference to FIG. 3B. In some cases, this may correspond to programming the memory device to store a logic value '1.'

At time T2, the memory cell may be biased to approximately 0 volts during the refresh phase 410 of the read operation. The refresh phase 410 of the operation may occur after the activation phase 405 and prior to the precharge phase 415 of the read operation. In some cases, the refresh phase 410 of the read operation may be representative of an open page access operation. In such cases, a duration of the open page access operation may extend from the end of the activation phase 405 to the start of the precharge phase 415 of the read operation.

At time T3, the memory device may initiate a precharge phase 415 of the read operation. During the precharge phase 415 of the read operation, the memory cell may be optionally biased to voltage 425 (e.g., V0) based on a value stored by the memory cell prior to the read operation. For example, if the memory cell was storing a logic value '1' prior to the read operation, the memory device may refrain from applying a precharge pulse. In some other cases, the memory cell may be optionally biased to voltage 440 (e.g., V1) during the precharge phase 415. For example, if the memory cell was storing a logic value '0' prior to the read operation, the memory device may apply a precharge pulse from time T3 to time T4. In some cases, a magnitude of the voltage 440 (e.g., V1) may be approximately equal to the write voltage 435 with an opposite polarity. The features of the timing diagram 200 may be used in a memory device that uses ferroelectric memory technology. In some cases, the features of the timing diagram 200 may be used in other types of memory technology, such as random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), or others.

Figure 5:
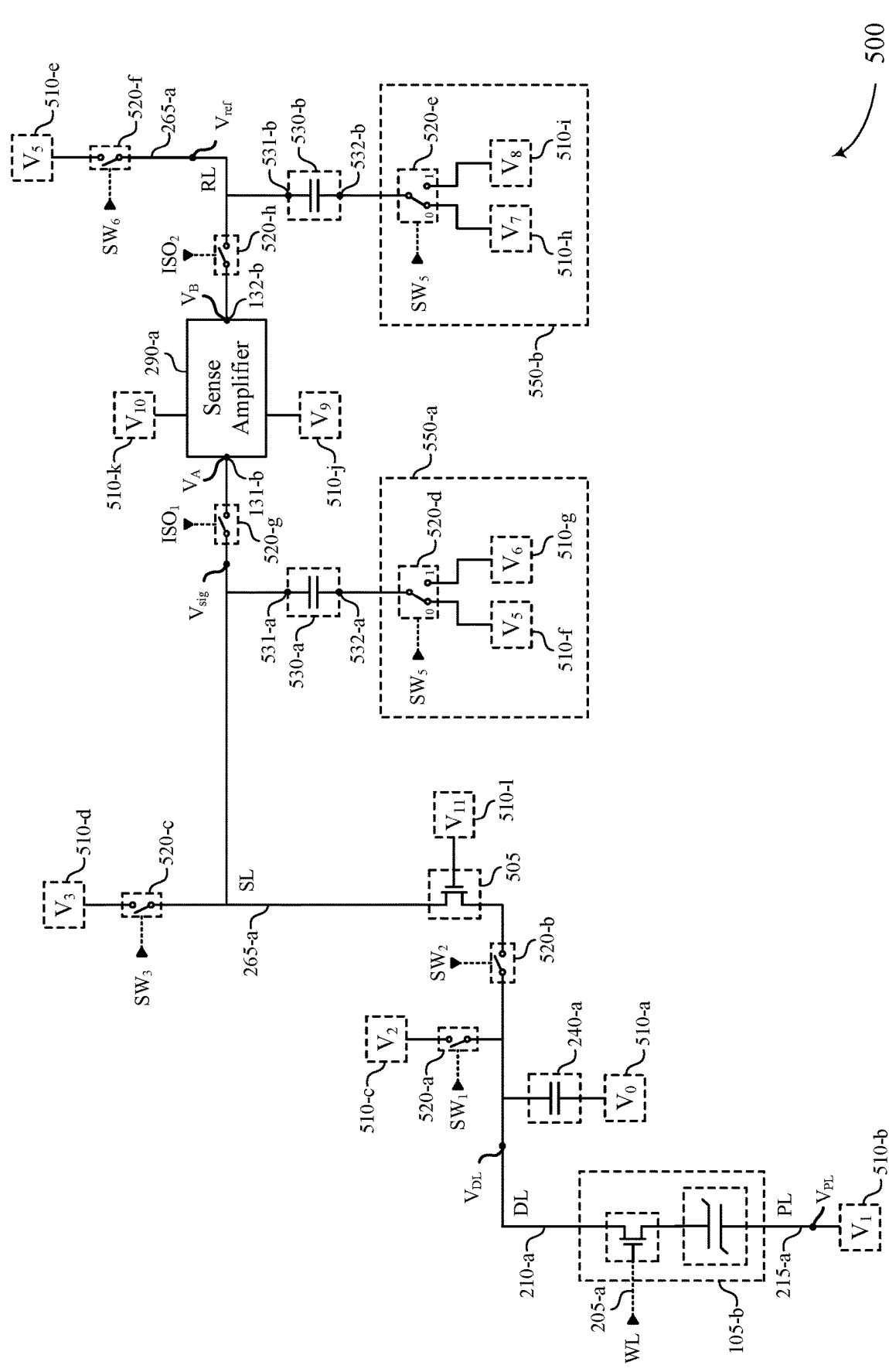
FIG. 5 illustrates an example of a circuit that supports
memory cell biasing techniques during a read operation in
accordance with examples as disclosed herein.

FIG. 5 illustrates an example of a circuit 500 that supports memory cell biasing techniques during a read operation in accordance with examples as disclosed herein. The circuit 500 includes a sense amplifier 290-a for sensing a logic state of a memory cell 105-b. Electrical charge or other signals may be communicated between the sense amplifier 290-a and the memory cell 105-b over a digit line 210-a and a signal line 265-a, which may, in combination, be referred to as a single access line of the memory cell 105-b. Signals of the access line may be illustrated by voltage $V_{DL}$ on the digit line 210-a, and $V_{sig}$ on the signal line 265-a, as shown.

The example circuit 500 may include a cascode 505 coupled between the digit line 210-a and the signal line 265-a, which may be enabled by voltage source 510-1. In various examples, the cascode 505 may be an example of a signal development component 260, or otherwise be included as part of a signal development component 260. The circuit 500 may also include a word line 205-a for selecting or deselecting the memory cell 105-b (e.g., by way of logic signal WL) and a reference line 285-a for providing a reference signal (e.g., $V_{ref}$, as shown) for comparison with a signal of the signal line 265-a when detecting a logic state of the memory cell 105-b. The circuit 500 may also include a plate line 215-a for accessing a cell plate of a capacitor of the memory cell 105-b. Thus, the memory cell 105-b may represent a memory cell 105 coupled between a first access line (e.g., the digit line 210-a and the signal line 265-a) and a second access line (e.g., the plate line 215-a).

The circuit 500 may include various voltage sources 510, which may be coupled with various voltage supplies or common grounding or virtual grounding points of a memory device that includes the example circuit 500.

A voltage source 510-a may represent a common grounding point (e.g., a chassis ground, a neutral point), which may be associated with a common reference voltage having a voltage $V_0$, from which other voltages are defined. The voltage source 510-a may be coupled with the digit line 210-a via the intrinsic capacitance 240-a of the digit line 210-a.

A voltage source 510-b having a voltage $V_1$ may represent a plate line voltage source, and may be coupled with the memory cell 105-b via a plate line 215-a of the memory cell 105-b. In some examples, the voltage source 510-b may be controlled for access operations such as read or write operations, including those operations described with reference to hysteresis plots 300-a and 300-b of FIG. 3. In other words, in some examples, the voltage source 510-b may be a variable voltage source, where a voltage $V_1$ may have multiple levels.

A voltage source 510-c having a voltage V2 may represent a digit line voltage source, and may be coupled with the digit line 210-a via a switching component 520-a, which may be activated or deactivated by a logical signal $SW_1$.

A voltage source 510-d having a voltage V3 may represent a signal line precharge voltage source, and may be coupled with the signal line 265-a via a switching component 520-c, which may be activated or deactivated by a logical signal $SW_3$.

A voltage source 510-e having a voltage V4 may represent a reference signal voltage source, and may be coupled with the reference line 285-a via a switching component 520-f, which may be activated or deactivated by a logical signal $SW_6$.

A voltage source 510-1 having a voltage $V_{11}$ may represent an amplifier or cascode voltage source, and may be coupled with the cascode 505. In some examples, the cascode 505 may be a transistor or an amplifier, and the voltage source 510-1 may be coupled with the gate of the transistor. The cascode 505 may be coupled with the signal line 265-a at a first terminal, and the digit line 210-a at a second terminal. In some cases, a cascode may include two or more transistors coupled in a cascode configuration.

The voltage source 510-1 may be configured to apply various voltages to the digit line 210-a. That is, the voltage source 510-a may apply a voltage $V_{11}$ to the gate of the cascode 505. The magnitude of the of the gate voltage applied to the gate of the cascode 505 may affect the voltage applied to the memory cell. For example, a first magnitude of the gate voltage applied to the gate of the cascode 505 may result in the read voltage (e.g., read pulse) being applied to the memory cell 105-b and a second magnitude of the gate voltage applied to the gate of the cascode 505 may result in the write voltage (e.g., write pulse) pulse being applied to the memory cell 105-b. If the voltage $V_{11}$ exceeds the gate voltage of the cascode 505, a voltage may be applied to the digit line 210-a (e.g., if the switch 520-b is closed). For example, during an activation phase of a read operation, the voltage source 510-1 may apply a voltage equivalent to a sum of the gate voltage of the cascode 505 and the read voltage. Thus, the read voltage may be applied to the digit line 210-a. After applying the read voltage to the digit line 210-a, the voltage source 510-1 may increase the voltage applied to the gate of the cascode 505 to a voltage approximately equal to the sum of the gate voltage of the cascode 505 and the write voltage. Here, the write voltage may be applied to the digit line 210-a during the activation phase of the read operation.

When applying a voltage to the digit line 210-a, the voltage across the memory cell 105-b (e.g., the bias voltage applied to the memory cell 105-b) may be approximately equal to a difference between the voltage of the digit line 210-a and the plate line 215-a. Here, the voltage of the plate line 215-a may be approximately equal to zero volts (e.g., $V_1$ may be approximately equal to zero volts) during the activation phase of the read operation. The memory cell 105-b may be biased to the read voltage then the write voltage during the activation phase based on the voltage source 510-1 applying voltages to the cascode 505 during the activation phase of the read operation.

The cascode 505 may provide a conversion of charge, voltage, or other signals between the digit line 210-a and the signal line 265-a. The cascode 505 may permit a flow of charge (e.g., electrical charge, electrical current) from the signal line 265-a to the digit line 210-a, as fed or enabled by the voltage source 510-1, upon a reduction in voltage of the digit line 210-a (e.g., upon selection of the memory cell 105-b). Thus, the cascode 505 may be referred to as a charge transfer component and may be configured to transfer a charge between the memory cell 105-b and the capacitor 530-a (e.g., associated with the sense component). In some examples, the described flow of charge across the cascode 505 (e.g., from the switch 420-b to the signal line 265-a) may correspond to a charge transfer associated with logic states of the memory cell 105-b, or a charge transfer otherwise associated with accessing the memory cell 105-b. For example, when the memory cell 105-b includes a ferroelectric capacitor as illustrated by the hysteresis plots 300-a and 300-b, and the cascode 505 is configured to maintain the voltage of the digit line 210-a to a read voltage (e.g., read voltage 315 as described with reference to FIG. 3, read voltage 430 as described with reference to FIG. 4), a flow of charge across the cascode 505 (e.g., while the memory cell 105-b is biased to the read voltage) may correspond to or be otherwise based at least in part on the difference in charge, Q, between charge states 305-b and 305-a when the memory cell 105-b stored a logic 0, and a flow of charge across the cascode 505 may correspond to or otherwise be based at least in part on the difference in charge, Q, between charge states 310-b and 310-a when the memory cell 105-b stored a logic 1.

The circuit 500 may also include a first integrator capacitor 530-a and a second integrator capacitor 530-b, which may each be coupled with a respective variable voltage source 550. For example, the first integrator capacitor 530-a may be coupled with the signal line 265-a at a first terminal 531-a, and coupled with a variable voltage source 550-a at a second terminal 532-a. The second integrator capacitor 530-b may be coupled with the reference line 285-a at a first terminal 531-b, and coupled with a variable voltage source 550-b at a second terminal 532-b In some examples, a flow of charge across the cascode 505 may be accompanied by a change in voltage of the signal line 265-a. For example, when the signal line 265-a is not otherwise coupled with a voltage source, a relatively small flow of charge to the digit line 210-a may be associated with a relatively small change in voltage of the signal line 265-a, whereas a relatively large flow of charge to the digit line 210-a may be associated with a relatively large change in voltage of the signal line 265-a. Changes in voltage of the signal line 265-a associated with an access operation may be based on the net capacitance of the signal line 265-a (e.g., including the integrator capacitor 530-a), where the signal line 265-a may undergo a relatively small change in voltage or a relatively large change in voltage depending on the flow of charge across the cascode 505 after selecting the memory cell 105-b.

In various examples, the cascode 505 may be referred to as a "voltage regulator" or a "bias component," relating to how the cascode 505 regulates a flow of charge in response to the voltage or charge transfer of the digit line 210-a. In some examples, the cascode 505, or combination of the cascode 505 and the integrator capacitor 530-a, may be referred to as a charge transfer sensing amplifier. The cascode 505 may be isolated from the digit line 210-a by a switching component 520-b, which may be activated or deactivated by a logical signal $SW_2$. In some examples, the switching component 520-b may be part of a column component 135, a multiplexer, or some other circuitry configured to selectively couple the digit line 210-a with the cascode 505 or the signal line 265-a.

In the example of circuit 500, the variable voltage source 550-a may include a voltage source 510-f having a voltage V5 and a voltage source 510-g having a voltage V6, which may be selected for connection with the first integrator capacitor 530-a by a switching component 520-d by way of a logical signal $SW_4$. In some examples, the voltage source 510-f may be coupled with a common grounding point (not shown). In other examples the voltage source 510-f may be coupled with a voltage supply that provides a positive or negative voltage. Voltage source 510-g may be coupled with a voltage supply having a higher voltage than that of voltage source 510-f, which may provide a voltage boosting function in accordance with the difference in voltage between voltage source 510-g and 510-f, equal to V6–V5, or simply V6 when the voltage source 510-f is grounded.

In the example of circuit 500, the variable voltage source 550-b may include a voltage source 510-h having a voltage V7 and a voltage source 510-i having a voltage $V_8$, which may be selected for connection with the second integrator capacitor 530-b by a switching component 520-e by way of a logical signal $SW_5$. In some examples, the voltage source 510-h may be coupled with a common grounding point (not shown). In other examples the voltage source 510-h may be coupled with a voltage supply that provides a positive or negative voltage. Voltage source 510-i may be coupled with a voltage supply having a higher voltage than that of voltage source 510-h, which may provide a voltage boosting function in accordance with the difference in voltage between voltage source 510-i and 510-h, equal to $V_8$–$V_7$, or simply $V_8$ when the voltage source 510-h is grounded.

In various examples, one or more components of the circuit 500 may be included in or otherwise considered to be part of signal development circuitry, such as a signal development component 260 described with reference to FIG. 2. For example, any one or more of the voltage source 510-c, the switching component 520-a, the switching component 520-b, the cascode 505, the voltage source 510-1, the voltage source 510-d, the switching component 520-c, the variable voltage source 550-a, or the integrator capacitor 530-a may be included in a signal development component 260, or otherwise be considered within the illustrative boundaries of such a signal development component 260.

Although circuit 500 is shown as including two variable voltage sources 550, some configurations in accordance with the present disclosure may include a single, common variable voltage source 550. For example, a first voltage source 510 of a common variable voltage source 550 may be coupled with both the second terminal 532-a of the first integrator capacitor 530-a and the second terminal 532-b of the second integrator capacitor 530-b when a switching component 520 of the common variable voltage source 550 is deactivated, and a second voltage source 510 of the common variable voltage source 550 may be coupled with both the second terminal 532-a of the first integrator capacitor 530-a and the second terminal 532-b of the second integrator capacitor 530-b when the switching component 520 of the common variable voltage source 550 is activated. In some examples that use a common variable voltage source 550, the source voltage provided to the second terminal 532-a of the first integrator capacitor 530-a may be different to the source voltage provided to the second terminal 532-b of the second integrator capacitor 530-b due to differences in the circuit (e.g., conductor length, width, resistance, capacitance) between the variable voltage source 550 and each of the integrator capacitors 530.

Further, although the variable voltage sources 550 are illustrated as including two voltage sources 510 and a switching component 520, a variable voltage source 550 supporting the operations herein may include other configurations, such as a voltage buffer that provides a variable voltage to one or both of the second terminal 532-a of the first integrator capacitor 530-a and the second terminal 532-b of the second integrator capacitor 530-b. In other examples, a variable voltage source 550 may be replaced with fixed voltage sources, or other types of voltage sources. Additionally or alternatively, the described operations of voltage boosting may be omitted from an access operation.

To support various operations described herein, the sense amplifier 290-a may be isolated from portions of the circuit 500. For example, the sense amplifier 290-a may be coupled with the signal line 265-a via a switching component 520-g (e.g., an isolation component, an activation component), which may be activated or deactivated by a logical signal ISO'. Additionally or alternatively, the sense amplifier 290-a may be coupled with the reference line 285-a via a switching component 520-h (e.g., an isolation component), which may be activated or deactivated by a logical signal $ISO_2$. Further, the sense amplifier 290-a may be coupled with a voltage source 510-j having a voltage V9 and a voltage source 510-k having a voltage of $V_{10}$, which may be examples of sense amplifier voltage sources 250-b and 250-c, described with reference to FIG. 2, respectively.

Each of the logical signals illustrated in circuit 500 may be provided by a memory controller (not shown), such as a memory controller 170 described with reference to FIG. 1. In some examples, certain logical signals may be provided by other components. For example, logical signal WL may be provided by a row decoder (not shown), which may be included in a row component 125 described with reference to FIG. 1.

In various examples, voltage sources 510 may be coupled with different configurations of voltage supplies or common grounding or virtual grounding points of a memory device that includes the example circuit 500. For example, in some examples, voltage sources 510-a, 510-f, 510-h, or 510-j, or any combination thereof, may be coupled with the same ground point or virtual ground point, and may provide substantially the same reference voltage for various operations of accessing the memory cell 105-b. In some examples, several voltage sources 510 may be coupled with the same voltage supply of a memory device. For example, in some examples, voltage sources 510-c, 510-d, 510-g, 510-i, or 510-k, or any combination thereof, may be coupled with a voltage supply having a certain voltage (e.g., a voltage of 1.5V, which may be referred to as "VARY"). In such examples, the signal line 265-a may be boosted to a voltage substantially equal to 2*VARY, or approximately 3.0V, prior to selecting the memory cell 105-b via word line 205-a for sensing. In other examples, voltage sources 510-g and 510-i may be coupled with a different voltage supply than other voltage supplies (e.g., a voltage of 1.2V, which may be referred to as "PDS"), which may thus be associated with a voltage boost of 1.2V.

In some examples, the voltage sources 510-j and 510-k may be selected according to particular input/output parameters. For example, voltage sources 510-j and 510-k may be substantially at 0V and 1V, respectively, in accordance with certain input/output component conventions such as some DRAM conventions. Although voltage sources 510 may be coupled with common voltage supplies or grounding points, the voltage of each of the voltage sources 510 coupled with a common voltage supply or common grounding point may be different due to various differences in the circuit (e.g., conductor length, width, resistance, capacitance) between the respective voltage sources 510 and the associated common voltage supply or common grounding point.

Voltage source 510-e may provide a reference voltage for sensing the logic state of the memory cell 105-b. For example, a voltage of V4 may be configured to be an average between signal line voltages associated with sensing a logic 1 and a logic 0. In some examples, a voltage of V4 may be provided as a voltage dropped from a voltage supply of the memory device, which may be the same voltage supply coupled with other voltage sources 510. For example, V4 may be provided by connecting voltage source 510-e with a same voltage supply as voltage source 510-d, but with an intervening electrical load (e.g., a resistive load or capacitance) between the voltage supply and the voltage source 510-*e*).

Figure 6:
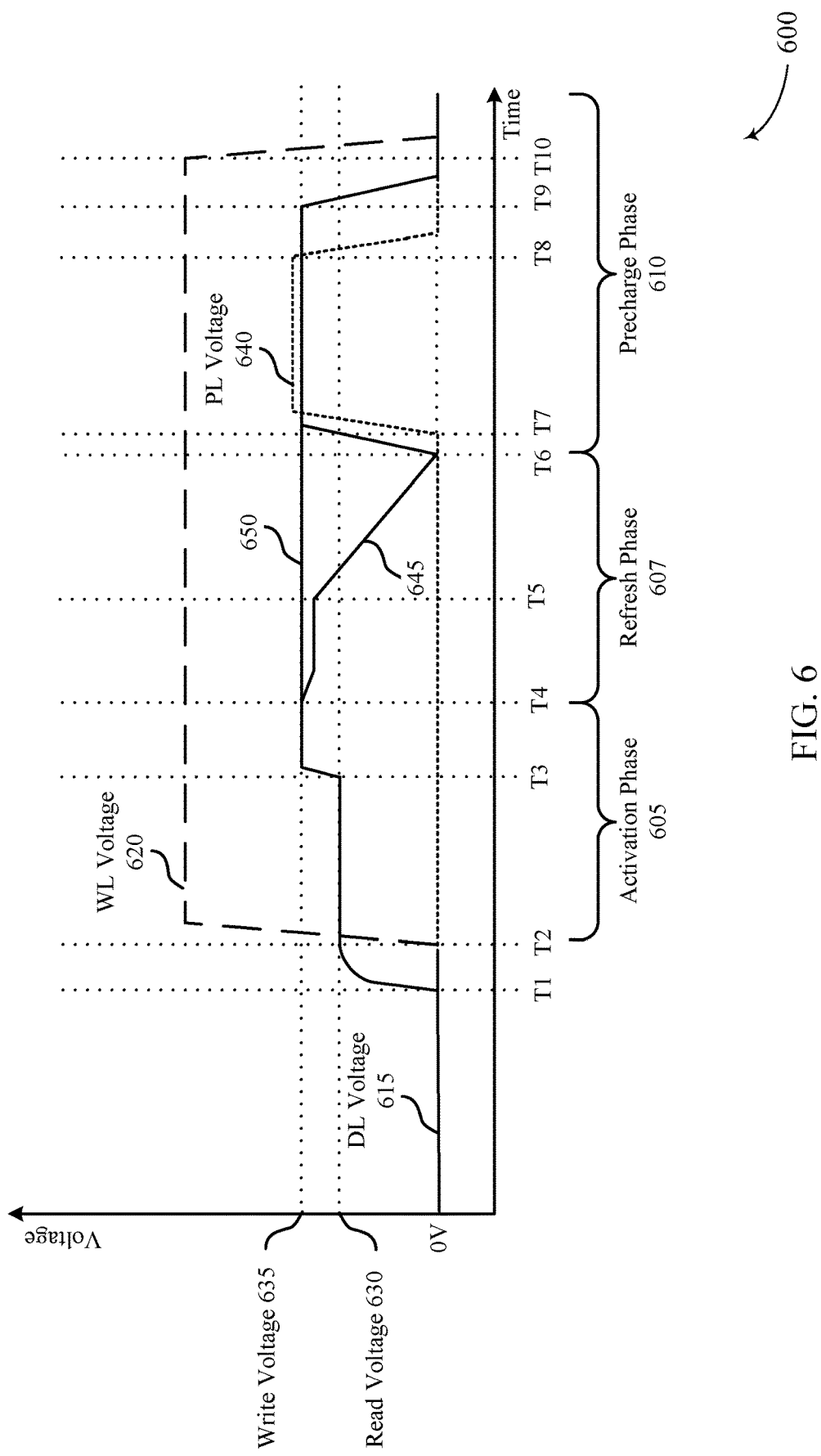
FIG. 6 illustrates an example voltage plot for a memory
cell that supports memory cell biasing techniques during a
read operation in accordance with examples as disclosed
herein.

FIG. 6 illustrates an example of a timing diagram 600 that supports memory cell biasing techniques during a read operation in accordance with examples as disclosed herein. Timing diagram 600 may illustrate an example read operation including an activation phase 605, a refresh phase 607, and a precharge phase 610. The timing diagram 600 may depict voltages as a function of time. For example, timing diagram 600 may include a digit line voltage 615, a word line voltage 620, and a plate line voltage 640.

At time T1, the digit line voltage 615 may be charged from 0V to the read voltage 630. For example, as described with reference to FIG. 5, a voltage source (e.g., voltage source 510-1) may apply a voltage approximately equal to a summation of the read voltage 630 and a gate voltage of the cascode to charge the digit line to the read voltage 630. At time T2, the word line voltage 620 may be charged from 0V to an activated word line voltage 620. In such cases, a voltage may be applied to the word line coupled with the memory cell during read operation. The memory cell may be accessed based on applying word line voltage 620 to the word line.

During a first portion of the activation phase 605 (e.g., from time T2 to time T3), the signal on the memory cell may develop while the digit line voltage 615 is approximately equal to the read voltage 630, and the digit line voltage 615, the plate line voltage 640, and the word line voltage 620 may be maintained at their respective voltages. Here, the memory cell may be biased to the read voltage 630 as the plate line voltage 640 is approximately equal to 0V. Between time T2 and time T3, charge may be transferred between the memory cell and a capacitor associated with the sense component (e.g., capacitor 530-*a* as described with reference to FIG. 5). In some cases, the signal may be amplified between the time T2 and time T3.

In some memory devices, the digit line voltage 615 may be set to the write voltage 635 during the first portion of the activation phase 605 (e.g., from time T2 to time T3). Here, the memory cell may be biased to approximately the write voltage 635 and charge may be similarly transferred between the memory cell and the capacitor associated with the sense component. In some cases, this may be associated with a lower device reliability (e.g., device lifetime) than memory devices that set the digit line voltage 615 to the read voltage 630 from time T2 to time T3. That is, applying the read voltage 630 to the digit line may decrease the voltage displacement during the read operation when compared to applying the write voltage 635 to the memory cell from time T2 to time T3. Additionally, it may desirable to minimize an amount of voltage displacement of the memory cell during access operations. Decreasing the voltage displacement during the read operation may decrease power consumption associated with the read operation and decrease leakage currents to other memory cells during the read operation. Additionally, decreasing the digit line voltage 615 from the write voltage 635 to the read voltage 630 from time T2 to time T3 may maintain a read window, thus maintaining a reliability of the read operation.

At time T3, the digit line voltage 615 may be increased from the read voltage 630 to the write voltage 635. For example, as described with reference to FIG. 5, a voltage source (e.g., voltage source 510-1) may apply a voltage approximately equal to a summation of the write voltage 635 and a gate voltage of the cascode to charge the digit line to the write voltage 635. In some cases, this may program the memory cell to a state (e.g., a logic 0 or a logic 1). In some cases, the sense component may be activated at time T3 or after time T3 based on increasing the digit line voltage 615 to the write voltage 635.

The refresh phase 607 may follow the activation phase 605 from time T4 to time T6. At time T4, the memory cell may be programmed to a state. For example, the memory cell may be programmed to a first state or a second state. If the memory cell is programmed to a first state, the digit line voltage 615 may decrease at time T5 until time T6 (e.g., as shown by digit line voltage 645). If the memory cell is programmed to a second state, the digit line voltage 615 may be maintained (e.g., as shown by digit line voltage 650).

At time T6, the precharge phase 610 of the read operation may be initiated. The digit line voltage 615 may increase as a voltage is applied to the digit line at time T6. In such cases, the memory cell may be programmed to the first state.

At time T7, the plate line voltage 640 may increase as a voltage is applied to the plate line during the precharge phase 610. Here, the memory cell may be biased to a voltage indicated by a difference between the plate line voltage 640 and the digit line voltage 615. In some cases, the polarity of the voltage bias to the memory cell during the precharge phase 610 may be an opposite polarity as the voltage bias applied to the memory cell during the activation phase 605.

At time T8, the memory device may begin to resolve the precharge phase 610 of the read operation and resolve the read operation at large. For example, the plate line voltage 640 may decrease to 0V.

At time T9, the memory device may continue resolving the precharge phase 610 by biasing the digit line voltage 615 to voltage 0V.

At time T10, the memory device may resolve and/or complete the read operation by deactivating the word line voltage 620. Upon biasing the word line voltage, the memory cell may be isolated from the digit line.

Figure 7:
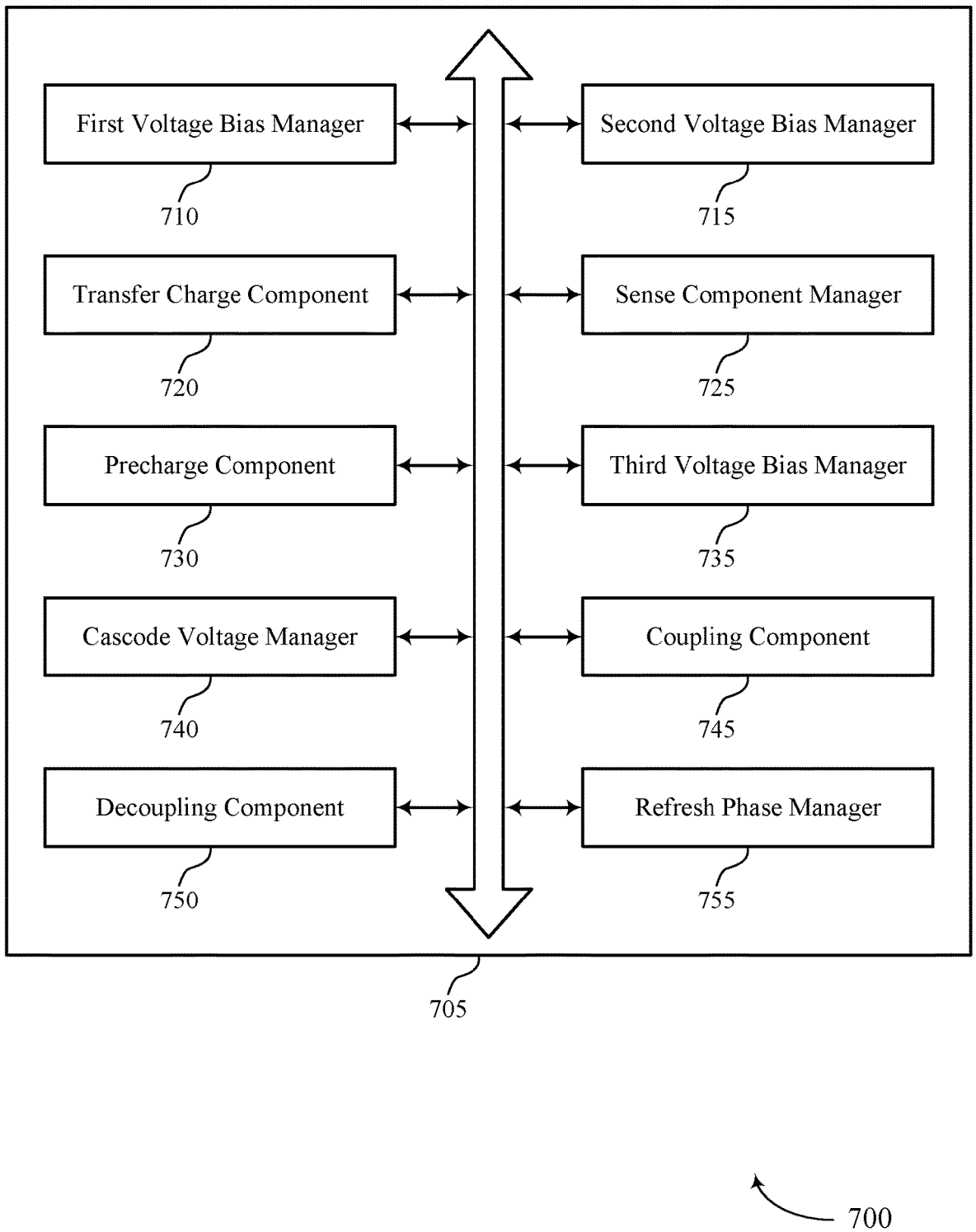
FIG. 7 shows a block diagram of a memory device that
supports memory cell biasing techniques during a read
operation in accordance with examples as disclosed herein.

FIG. 7 shows a block diagram 700 of a memory device 705 that supports memory cell biasing techniques during a read operation in accordance with examples as disclosed herein. The memory device 705 may be an example of aspects of a memory device as described with reference to FIGS. 1 through 7. The memory device 705 may include a first voltage bias manager 710, a second voltage bias manager 715, a transfer charge component 720, a sense component manager 725, a precharge component 730, a third voltage bias manager 735, a cascode voltage manager 740, a coupling component 745, a decoupling component 750, and a refresh phase manager 755. Each of these modules may communicate, directly or indirectly, with one another (e.g., via one or more buses).

The first voltage bias manager 710 may bias a memory cell to a first voltage during an activation phase of a read operation. In some examples, biasing the memory cell to the first voltage may be based on a difference between a third voltage (e.g., applied to a gate of a cascode that selectively couples a digit line with a sense component) and a threshold voltage of the cascode. In some cases, biasing the memory cell to the first voltage is based on a voltage difference between a digit line and a plate line coupled with the memory cell.

The second voltage bias manager 715 may bias, after biasing the memory cell to the first voltage, the memory cell to a second voltage greater than the first voltage during the activation phase of the read operation. In some cases, biasing the memory cell to the second voltage is based on a voltage difference between the digit line and the plate line coupled with the memory cell. In some instances, biasing the memory cell to the second voltage is based on a difference between a fourth voltage (e.g., applied to the gate of the cascode that selectively couples the digit line with the sense component) and the threshold voltage of the cascode.

The transfer charge component 720 may transfer a charge between the memory cell and a capacitor associated with the sense component based on biasing the memory cell to the first voltage, where biasing the memory cell to the second voltage is based on transferring the charge.

The sense component manager 725 may activate the sense component to store a value associated with the memory cell based on biasing the memory cell to the second voltage, where initiating the refresh phase of the read operation is based on activating the sense component.

The precharge component 730 may initiate, after the refresh phase of the read operation, a precharge phase of the read operation based on a value stored by the memory cell prior to biasing the memory cell to the first voltage.

The third voltage bias manager 735 may bias the memory cell to a third voltage based on initiating the precharge phase of the read operation, where the first voltage and the second voltage have a first polarity and the third voltage has a second polarity different than the first polarity.

The cascode voltage manager 740 may apply the third voltage to the gate of the cascode that selectively couples the digit line with the sense component, where biasing the memory cell to the first voltage is based on applying the third voltage to the gate of the cascode. In some instances, the cascode voltage manager 740 may apply the fourth voltage greater than the third voltage to the gate of the cascode, where biasing the memory cell to the second voltage is based at least in part on applying the fourth voltage to the gate of the cascode.

The coupling component 745 may couple the memory cell with the digit line after applying the third voltage to the cascode, where biasing the memory cell to the first voltage during the activation phase of the read operation is based on coupling the memory cell with the digit line.

The decoupling component 750 may decouple the memory cell from the digit line after initiating a precharge phase of the read operation.

The refresh phase manager 755 may initiate a refresh phase of the read operation based on biasing the memory cell to the second voltage. In some examples, the refresh phase manager 755 may maintain the memory cell at the second voltage during the refresh phase of the read operation based on a first value being stored by the memory cell prior to biasing the memory cell to the first voltage. Additionally or alternatively, the refresh phase manager 755 may decrease, from the second voltage, a bias applied to the memory cell during the refresh phase of the read operation based on a second value being stored by the memory cell prior to biasing the memory cell to the first voltage.

Figure 8:
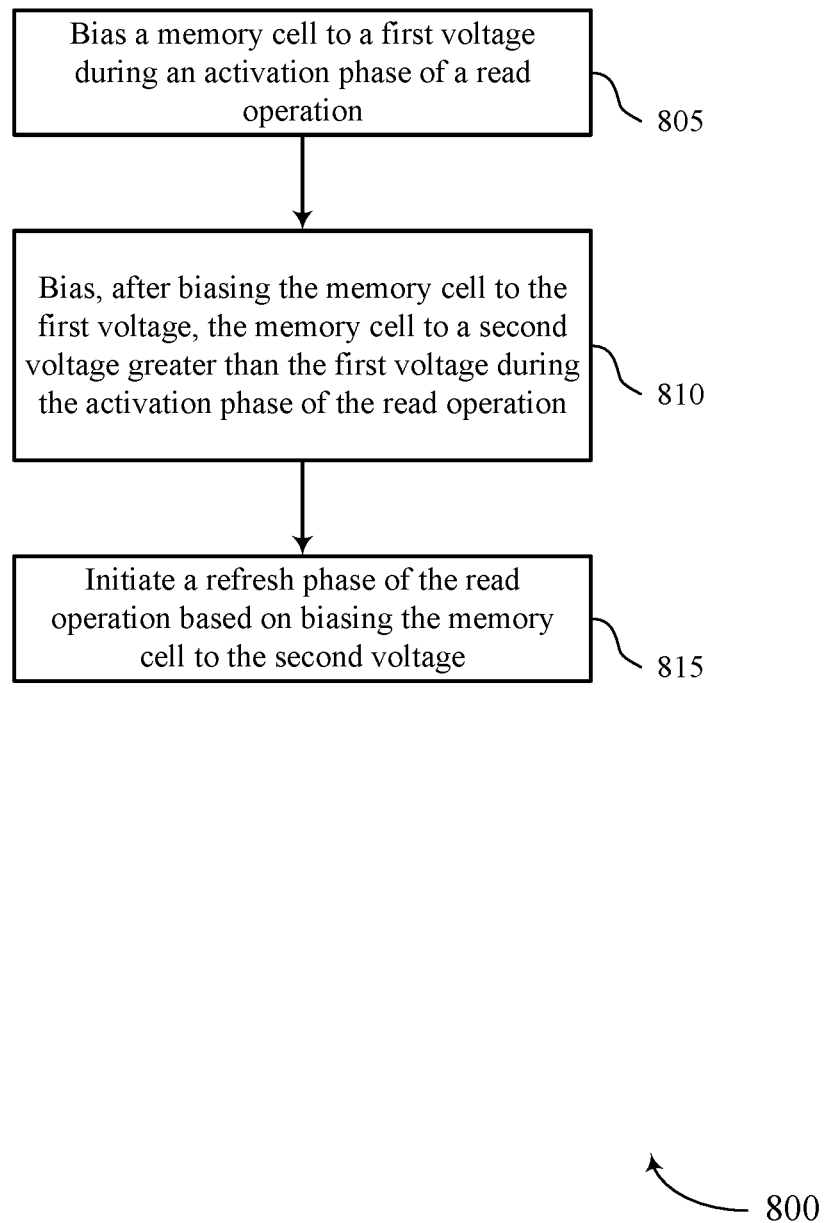

FIG. 8 shows a flowchart illustrating a method or methods 800 that supports memory cell biasing techniques during a read operation in accordance with examples as disclosed herein. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may bias a memory cell to a first voltage during an activation phase of a read operation. The operations of 805 may be performed according to the methods described herein. In some examples, aspects of the operations of 805 may be performed by a first voltage bias manager as described with reference to FIG. 7.

At 810, the memory device may bias, after biasing the memory cell to the first voltage, the memory cell to a second voltage greater than the first voltage during the activation phase of the read operation. The operations of 810 may be performed according to the methods described herein. In some examples, aspects of the operations of 810 may be performed by a second voltage bias manager as described with reference to FIG. 7.

At 815, the memory device may initiate a refresh phase of the read operation based on biasing the memory cell to the second voltage. The operations of 815 may be performed according to the methods described herein. In some examples, aspects of the operations of 815 may be performed by a refresh phase manager as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for biasing a memory cell to a first voltage during an activation phase of a read operation, biasing, after biasing the memory cell to the first voltage, the memory cell to a second voltage greater than the first voltage during the activation phase of the read operation, and initiating a refresh phase of the read operation based on biasing the memory cell to the second voltage.

Some cases of the method 800 and the apparatus described herein may further include operations, features, means, or instructions for transferring a charge between the memory cell and a capacitor associated with a sense component based on biasing the memory cell to the first voltage, where biasing the memory cell to the second voltage may be based on transferring the charge.

Some instances of the method 800 and the apparatus described herein may further include operations, features, means, or instructions for activating a sense component to store a value associated with the memory cell based on biasing the memory cell to the second voltage, where initiating the refresh phase of the read operation may be based on activating the sense component.

Some examples of the method 800 and the apparatus described herein may further include operations, features, means, or instructions for initiating, after the refresh phase of the read operation, a precharge phase of the read operation based on a value stored by the memory cell prior to biasing the memory cell to the first voltage.

Some cases of the method 800 and the apparatus described herein may further include operations, features, means, or instructions for biasing the memory cell to a third voltage based on initiating the precharge phase of the read operation, where the first voltage and the second voltage may have a first polarity and the third voltage may have a second polarity different than the first polarity.

Some instances of the method 800 and the apparatus described herein may further include operations, features, means, or instructions for applying a third voltage to a gate of a cascode that selectively couples a digit line with a sense component, where biasing the memory cell to the first voltage may be based on applying the third voltage to the gate of the cascode, and applying a fourth voltage greater than the third voltage to the gate of the cascode, where biasing the memory cell to the second voltage may be based at least in part on applying the fourth voltage to the gate of the cascode.

In some examples of the method 800 and the apparatus described herein, biasing the memory cell to the first voltage may be based at least on a difference between the third voltage and a threshold voltage of the cascode, and biasing the memory cell to the second voltage may be based on a difference between the fourth voltage and the threshold voltage of the cascode.

Some cases of the method 800 and the apparatus described herein may further include operations, features, means, or instructions for coupling the memory cell with the digit line after applying the third voltage to the cascode, where biasing the memory cell to the first voltage during the activation phase of the read operation may be based on coupling the memory cell with the digit line.

Some instances of the method 800 and the apparatus described herein may further include operations, features, means, or instructions for decoupling the memory cell from the digit line after initiating a precharge phase of the read operation.

Some examples of the method 800 and the apparatus described herein may further include operations, features, means, or instructions for maintaining the memory cell at the second voltage during the refresh phase of the read operation based on a first value being stored by the memory cell prior to biasing the memory cell to the first voltage; or decreasing, from the second voltage, a bias applied to the memory cell during the refresh phase of the read operation based on a second value being stored by the memory cell prior to biasing the memory cell to the first voltage.

In some cases of the method 800 and the apparatus described herein, biasing the memory cell to the first voltage and the second voltage may be based on a voltage difference between a digit line and a plate line coupled with the memory cell.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a biasing component configured to bias a memory cell to a first voltage during an activation phase of a read operation, and bias, after biasing the memory cell to the first voltage, the memory cell to a second voltage greater than the first voltage during the activation phase of the read operation. The apparatus may further include a refresh component for initiating a refresh phase of the read operation based on biasing the memory cell to the second voltage.

Some examples of the apparatus may include a charge transfer component for transferring a charge between the memory cell and a capacitor associated with a sense component based on biasing the memory cell to the first voltage, where biasing the memory cell to the second voltage may be based on transferring the charge.

Some cases of the apparatus may include an activation component for activating a sense component to store a value associated with the memory cell based on biasing the memory cell to the second voltage, where initiating the refresh phase of the read operation may be based on activating the sense component.

Some instances of the apparatus may include a precharge component for initiating, after the refresh phase of the read operation, a precharge phase of the read operation based on a value stored by the memory cell prior to biasing the memory cell to the first voltage.

In some examples, the biasing component may be further configured to bias the memory cell to a third voltage based on initiating the precharge phase of the read operation, where the first voltage and the second voltage may have a first polarity and the third voltage may have a second polarity different than the first polarity.

In some cases, the biasing component may be further configured to apply a third voltage to a gate of a cascode that selectively couples a digit line with a sense component, where biasing the memory cell to the first voltage may be based on applying the third voltage to the gate of the cascode, and apply a fourth voltage greater than the third voltage to the gate of the cascode, where biasing the memory cell to the second voltage may be based on applying the fourth voltage to the gate of the cascode.

In some instances, biasing the memory cell to the first voltage may be based at least on a difference between the third voltage and a threshold voltage of the cascode, and biasing the memory cell to the second voltage may be based on a difference between the fourth voltage and the threshold voltage of the cascode.

Some examples of the apparatus may include a coupling component configured to couple the memory cell with the digit line after applying the third voltage to the cascode, where biasing the memory cell to the first voltage during the activation phase of the read operation may be based on coupling the memory cell with the digit line.

In some cases, the coupling component may be further configured to decouple the memory cell from the digit line after initiating a precharge phase of the read operation.

In some instances, the biasing component may be further configured to maintain the memory cell at the second voltage during the refresh phase of the read operation based on a first value being stored by the memory cell prior to biasing the memory cell to the first voltage; or decrease, from the second voltage, a bias applied to the memory cell during the refresh phase of the read operation based on a second value being stored by the memory cell prior to biasing the memory cell to the first voltage.

In some examples, biasing the memory cell to the first voltage and the second voltage may be based on a voltage difference between a digit line and a plate line coupled with the memory cell.

An apparatus is described. The apparatus may include a memory array and a controller coupled with the memory array and operable to bias a memory cell of the memory array to a first voltage during an activation phase of a read operation, bias, after biasing the memory cell to the first voltage, the memory cell to a second voltage greater than the first voltage during the activation phase of the read operation, and initiate a refresh phase of the read operation based on biasing the memory cell to the second voltage.

In some examples, the controller may be further operable to transfer a charge between the memory cell and a capacitor associated with a sense component based on biasing the memory cell to the first voltage, where biasing the memory cell to the second voltage may be based on transferring the charge.

In some cases, the controller may be further operable to activate a sense component to store a value associated with the memory cell based on biasing the memory cell to the second voltage, where initiating the refresh phase of the read operation may be based on activating the sense component.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a biasing component configured to:
apply a first voltage to a digit line of a memory cell during a first phase of an access operation;
increase the first voltage to a second voltage during the first phase of the access operation;
maintain a third voltage at a plate line of the memory cell for a duration based at least in part on increasing the first voltage to the second voltage; and
initiate a second phase of the access operation based at least in part on a voltage difference between the second voltage and the third voltage.

2. The apparatus of claim 1, further comprising:
a charge transfer component for transferring a charge between the memory cell and a capacitor associated with a sense component based at least in part on a second difference between the first voltage and the third voltage, wherein the biasing component is configured to increase the first voltage to the second voltage based at least in part on transferring the charge.

3. The apparatus of claim 1, further comprising:
an activation component for activating a sense component to store a value associated with the memory cell based at least in part on increasing the first voltage to the second voltage, wherein the biasing component is configured to initiate the second phase of the access operation based at least in part on activating the sense component.

4. The apparatus of claim 1, further comprising:
a precharge component for initiating, after the second phase of the access operation, a third phase of the access operation based at least in part on a value stored by the memory cell prior to increasing the first voltage to the second voltage.

5. The apparatus of claim 1, wherein the biasing component is further configured to:
apply a fourth voltage to a gate of a cascode that selectively couples the digit line with a sense component, wherein applying the first voltage to the digit line is based at least in part on applying the fourth voltage to the gate of the cascode; and
apply a fifth voltage greater than the fourth voltage to the gate of the cascode, wherein the biasing component is configured to increase the first voltage to the second voltage based at least in part on applying the fifth voltage to the gate of the cascode.

6. The apparatus of claim 5, wherein:
applying the first voltage to the digit line is based at least on a difference between the fourth voltage and a threshold voltage of the cascode; and
increasing the first voltage to the second voltage is based at least in part on a difference between the fifth voltage and the threshold voltage of the cascode.

7. The apparatus of claim 5, further comprising:
a coupling component configured to couple the memory cell with the digit line after applying the fourth voltage to the cascode, wherein the biasing component is configured to apply the first voltage to the digit line based at least in part on coupling the memory cell with the digit line.

8. The apparatus of claim 7, wherein the coupling component is further configured to:
decouple the memory cell from the digit line after initiating a third phase of the access operation.

9. The apparatus of claim 1, wherein the biasing component is further configured to:
maintain the digit line at the second voltage during the second phase of the access operation based at least in part on a first value being stored by the memory cell prior to applying the first voltage to the digit line; or
decrease, from the second voltage, during the second phase of the access operation based at least in part on a second value being stored by the memory cell prior to applying the first voltage to the digit line.

10. A method, comprising:
applying a first voltage to a digit line of a memory cell during a first phase of an access operation;
increasing the first voltage to a second voltage during the first phase of the access operation;
maintaining a third voltage at a plate line of the memory cell for a duration based at least in part on increasing the first voltage to the second voltage; and
initiating a second phase of the access operation based at least in part on a voltage difference between the second voltage and the third voltage.

11. The method of claim 10, further comprising:
transferring a charge between the memory cell and a capacitor associated with a sense component based at least in part on a second difference between the first voltage and the third voltage, wherein increasing the first voltage to the second voltage is based at least in part on transferring the charge.

12. The method of claim 10, further comprising:
activating a sense component to store a value associated with the memory cell based at least in part on increasing the first voltage to the second voltage, wherein initiating the second phase of the access operation is based at least in part on activating the sense component.

13. The method of claim 10, further comprising:
initiating, after the second phase of the access operation, a third phase of the access operation based at least in part on a value stored by the memory cell prior to increasing the first voltage to the second voltage.

14. The method of claim 10, further comprising:
applying a fourth voltage to a gate of a cascode that selectively couples the digit line with a sense component, wherein applying the first voltage to the digit line is based at least in part on applying the fourth voltage to the gate of the cascode; and
applying a fifth voltage greater than the fourth voltage to the gate of the cascode,
wherein increasing the first voltage to the second voltage is based at least in part on applying the fifth voltage to the gate of the cascode.

15. The method of claim 14, wherein:
applying the first voltage to the digit line is based at least on a difference between the fourth voltage and a threshold voltage of the cascode; and
increasing the first voltage to the second voltage is based at least in part on a difference between the fifth voltage and the threshold voltage of the cascode.

16. The method of claim 14, further comprising:
coupling the memory cell with the digit line after applying the fourth voltage to the cascode, wherein applying the first voltage to the digit line is based at least in part on coupling the memory cell with the digit line.

17. The method of claim 16, further comprising:
decoupling the memory cell from the digit line after initiating a third phase of the access operation.

18. The method of claim 10, further comprising:
maintaining the digit line at the second voltage during the second phase of the access operation based at least in part on a first value being stored by the memory cell prior to applying the first voltage to the digit line; or
decreasing, from the second voltage, during the second phase of the access operation based at least in part on a second value being stored by the memory cell prior to applying the first voltage to the digit line.

19. The method of claim 10, further comprising:
increasing the first voltage to the second voltage is based at least in part on a voltage difference between the digit line and the plate line.

20. An apparatus, comprising:
a memory array; and
a controller coupled with the memory array and operable to:
apply a first voltage to a digit line of a memory cell during a first phase of an access operation;
increase the first voltage to a second voltage during the first phase of the access operation;
maintain a third voltage at a plate line of the memory cell for a duration based at least in part on increasing the first voltage to the second voltage; and
initiate a second phase of the access operation based at least in part on a voltage difference between the second voltage and the third voltage.

* * * * *